United States Patent
Radu et al.

(10) Patent No.: US 9,525,134 B1
(45) Date of Patent: Dec. 20, 2016

(54) HOLE TRANSPORT MATERIALS

(71) Applicant: E I DU PONT DE NEMOURS AND COMPANY, Wilmington, DE (US)

(72) Inventors: Nora Sabina Radu, Landenberg, PA (US); Adam Fennimore, Wilmington, DE (US); Tiffany N. Hoerter, West Grove, PA (US); Gene M Rossi, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/823,310

(22) Filed: Aug. 11, 2015

(51) Int. Cl.
*H01L 51/00* (2006.01)
*C08G 61/12* (2006.01)
*H01L 51/50* (2006.01)

(52) U.S. Cl.
CPC ......... *H01L 51/0035* (2013.01); *C08G 61/128* (2013.01); *C08G 2261/224* (2013.01);
(Continued)

(58) Field of Classification Search
CPC ................. H01L 51/0035; H01L 51/5056
See application file for complete search history.

(56) References Cited

U.S. PATENT DOCUMENTS 6,670,645 B2   12/2003   Grushin et al.
7,351,358 B2   4/2008    Smith et al.
(Continued)

FOREIGN PATENT DOCUMENTS

WO   03/008424 A1   1/2003
WO   03/040257 A1   5/2003
(Continued)

OTHER PUBLICATIONS

CRC Handbook of Chemistry & Physics, 81$^{st}$ Edition, (2000-2001)—Book Not Included.
(Continued)

*Primary Examiner* — Mamadou Diallo

(57) ABSTRACT

There is provided a hole transport compound having Formula I

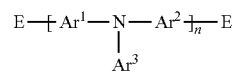

In Formula I: $Ar^1$-$Ar^3$ are selected from the group consisting of aryl groups and deuterated aryl groups; with the proviso that $Ar^1$ is not the same as $Ar^2$, E is the same or different at each occurrence, and n is an integer greater than or equal to 1.

There is also a hole transport compound having Formula II

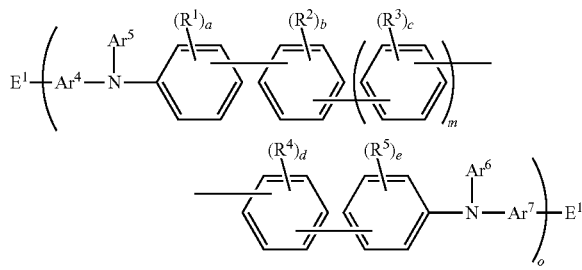

In Formula II: $Ar^4$-$Ar^7$ are the same or different and are aryl groups or deuterated aryl groups; $E^1$ is the same or different
(Continued)

at each occurrence; $R^1$-$R^5$ are the same or different at each occurrence; a-e are the same or different and are in integer from 0-4; m is an integer from 0-6; o is an integer greater than or equal to 1. There is also provided an organic electronic device.

20 Claims, 2 Drawing Sheets

(52) U.S. Cl.
CPC .............. *C08G 2261/312* (2013.01); *C08G 2261/3162* (2013.01); *C08G 2261/512* (2013.01); *C08G 2261/598* (2013.01); *C08G 2261/95* (2013.01); *H01L 51/5056* (2013.01)

(56) References Cited

U.S. PATENT DOCUMENTS

| | | | |
|---|---|---|---|
| 7,858,724 B2* | 12/2010 | Kanitz | C07F 15/0033 528/394 |
| 8,465,848 B2 | 6/2013 | Smith | |
| 2004/0102577 A1 | 5/2004 | Hsu et al. | |
| 2004/0127637 A1 | 7/2004 | Hsu et al. | |
| 2005/0205860 A1 | 9/2005 | Hsu et al. | |
| 2008/0220349 A1* | 9/2008 | Wu | G03G 5/0539 430/58.2 |
| 2010/0252819 A1* | 10/2010 | Lecloux | C07C 211/54 257/40 |
| 2013/0082251 A1* | 4/2013 | Park | C07C 211/54 257/40 |
| 2013/0248848 A1* | 9/2013 | Radu | H01L 51/0018 257/40 |

FOREIGN PATENT DOCUMENTS

| | | |
|---|---|---|
| WO | 03/063555 A1 | 7/2003 |
| WO | 03/091688 A2 | 11/2003 |
| WO | 2004/016710 A1 | 2/2004 |
| WO | 2005/052027 A1 | 6/2005 |
| WO | 2007/145979 A2 | 12/2007 |

OTHER PUBLICATIONS

Kirk-Othmer Encyclopedia of Chemical Technology, 4$^{th}$ Edition, vol. 18, pp. 837-860 by Y. Wang—Book Not Included.

G. Gustafsson; Y. Cao, G.M. Treacy, F. Klavetter, N. Colaneri, A.J. Heeger, Nature, "Flexible Light-Emitting Diodes Made From Soluble Conducting Polymers", vol. 357, pp. 477-479, Jun. 11, 1992.

\* cited by examiner

HOLE TRANSPORT MATERIALS

BACKGROUND INFORMATION

Field of the Disclosure

The present disclosure relates to novel hole transport compounds. The disclosure further relates to electronic devices having at least one layer comprising such an hole transport compound.

Description of the Related Art

In organic electronic devices, such as organic light emitting diodes ("OLED") that make up OLED displays, one or more organic electroactive layers are sandwiched between two electrical contact layers. In an OLED, at least one organic electroactive layer emits light through the light-transmitting electrical contact layer upon application of a voltage across the electrical contact layers.

It is well known to use organic electroluminescent compounds as the light emitting component in light-emitting diodes. Simple organic molecules, conjugated polymers, and organometallic complexes have been used.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a hole transport compound having Formula I

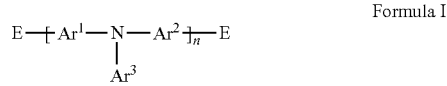

Formula I wherein:
  $Ar^1$-$Ar^3$ are selected from the group consisting of aryl groups and deuterated aryl groups, with the proviso that $Ar^1$ is not the same as $Ar^2$;
  E is the same or different at each occurrence and is selected from the group consisting of H, D, halide, alkyl, aryl, siloxane, deuterated alkyl, deuterated aryl, deuterated siloxane, and a crosslinking group; and
  n is an integer greater than or equal to 1.

There is further provided a hole transport compound having Formula II

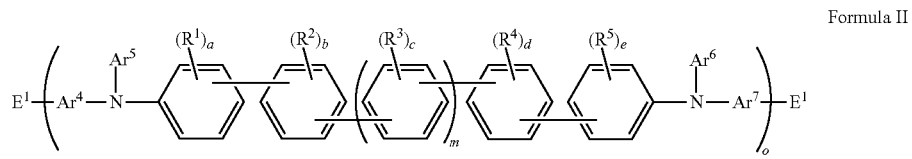

Formula II wherein:
  $Ar^4$-$Ar^7$ are the same or different and are aryl groups or deuterated aryl groups;
  $E^1$ is the same or different at each occurrence and is selected from the group consisting of H, D, halide, alkyl, aryl, siloxane, deuterated alkyl, deuterated aryl, deuterated siloxane, and a crosslinking group;
  $R^1$-$R^5$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$-$R^5$ can be joined together to form a fused ring;
  a-e are the same or different and are in integer from 0-4;
  m is an integer from 0-6;
  o is an integer greater than or equal to 1;
  with the proviso that at least two of a-e are greater than zero and at least two of $R^1$-$R^5$ are not D.

There is further provided a hole transport compound having Formula IIa

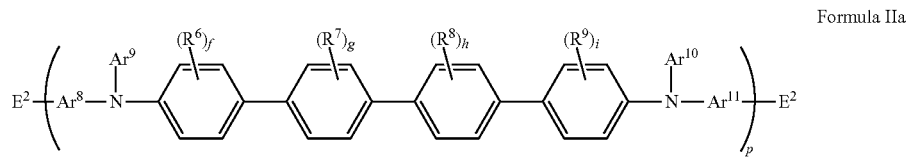

Formula IIa wherein:
   Ar$^8$-Ar$^{11}$ are the same or different and are aryl groups or deuterated aryl groups;
   E$^2$ is the same or different at each occurrence and is selected from the group consisting of H, D, halide, alkyl, aryl, siloxane, deuterated alkyl, deuterated aryl, deuterated siloxane, and a crosslinking group;
   R$^6$-R$^9$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R$^1$-R$^5$ can be joined together to form a fused ring;
   f-i are the same or different and are in integer from 0-4;
   p is an integer greater than or equal to 1;
with the proviso that at least two of f-i are greater than zero and at least two of R$^6$-R$^9$ are not D.

There is also provided an electronic device having at least one layer comprising a compound of Formula I, Formula II, or Formula IIa.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
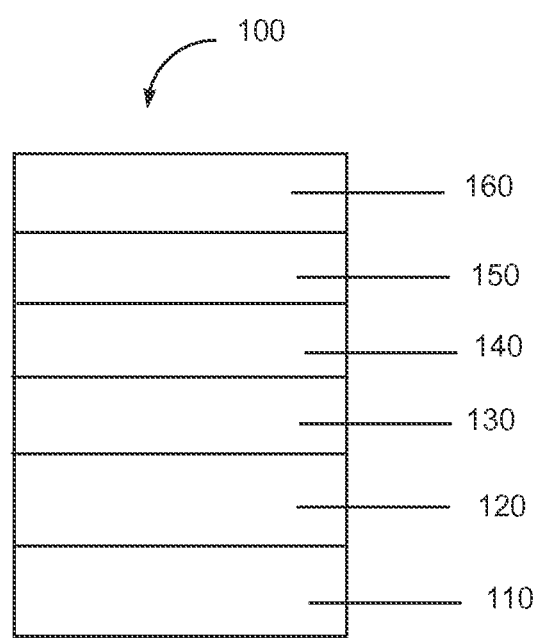
FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a hole transport compound having Formula I

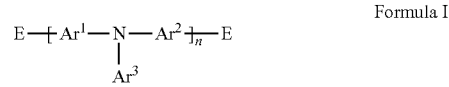

wherein:
   Ar$^1$-Ar$^3$ are selected from the group consisting of aryl groups and deuterated aryl groups, with the proviso that Ar$^1$ is not the same as Ar$^2$;
   E is the same or different at each occurrence and is selected from the group consisting of H, D, halide, alkyl, aryl, siloxane, deuterated alkyl, deuterated aryl, deuterated siloxane, and a crosslinking group;

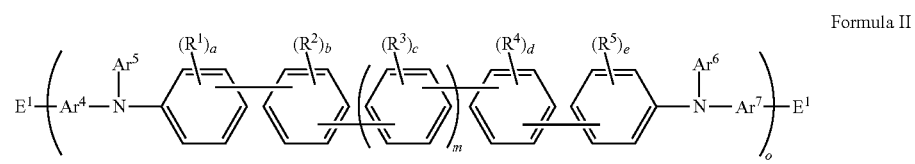

and
   n is an integer greater than or equal to 1.

There is further provided a hole transport compound having Formula II
wherein:
   Ar$^4$-Ar$^7$ are the same or different and are aryl groups or deuterated aryl groups;
   E$^1$ is the same or different at each occurrence and is selected from the group consisting of H, D, halide, alkyl, aryl, siloxane, deuterated alkyl, deuterated aryl, deuterated siloxane, and a crosslinking group;
   R$^1$-R$^5$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R$^1$-R$^5$ can be joined together to form a fused ring;
   a-e are the same or different and are in integer from 0-4;
   m is an integer from 0-6;
   o is an integer greater than or equal to 1;
with the proviso that at least two of a-e are greater than zero and at least two of R$^1$-R$^5$ are not D.

There is further provided a hole transport compound having Formula IIa

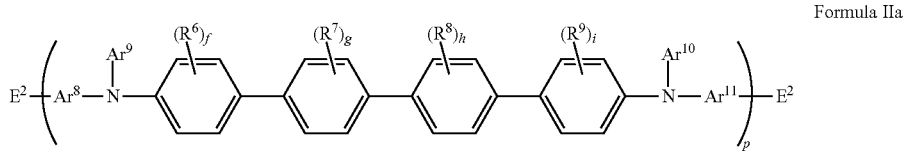

Formula IIa wherein:
- $Ar^8$-$Ar^{11}$ are the same or different and are aryl groups or deuterated aryl groups;
- $E^2$ is the same or different at each occurrence and is selected from the group consisting of H, D, halide, alkyl, aryl, siloxane, deuterated alkyl, deuterated aryl, deuterated siloxane, and a crosslinking group;
- $R^6$-$R^9$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$-$R^5$ can be joined together to form a fused ring;
- f-i are the same or different and are in integer from 0-4;
- p is an integer greater than or equal to 1;

with the proviso that at least two of f-i are greater than zero and at least two of $R^6$-$R^9$ are not D.

There is further provided an electronic device having at least one layer comprising a compound of Formula I, Formula II, or Formula IIa.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description and from the claims. The detailed description first addresses Definitions and Clarification of Terms, followed by the Compound of Formula I, the Compound of Formula II, the Compound of Formula IIa, the Electronic Device, and finally Examples.

1. Definitions and Clarification of Terms

Before addressing details of embodiments described below, some terms are defined or clarified.

As used herein, the term "adjacent" as it refers to substituent groups refers to groups that are bonded to carbons that are joined together with a single or multiple bond. Exemplary adjacent R groups are shown below:

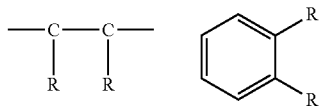

The term "alkoxy" is intended to mean the group RO-x, where R is an alkyl group.

The term "alkyl" includes branched and straight-chain saturated aliphatic hydrocarbon groups. Unless otherwise indicated, the term is also intended to include cyclic groups. Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "amino group" is intended to mean the group —NR2, where R is the same or different at each occurrence and can be an alkyl group, an aryl group, or deuterated analogs thereof.

The term "aromatic compound" is intended to mean an organic compound comprising at least one unsaturated cyclic group having delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "aryl" or "aryl group" means a moiety derived from an aromatic compound. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. In some embodiments, aryl groups have 6 to 60 ring carbon atoms; in some embodiments, 6 to 30 ring carbon atoms. The term is intended to include hydrocarbon aryls, having only carbon atoms and hydrogen atoms; and heteroaryls, having at least one heteroatom in one or more of the rings. Heteroaryl groups may have from 4-50 ring carbon atoms; in some embodiments, 4-30 ring carbon atoms.

The term "aryloxy" is intended to mean the group —OR, where R is aryl.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), internal alkenes (e.g., stillbene) cycloalkenes, and acetylenic groups.

The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The prefix "hetero" indicates that one or more carbon atoms has been replaced with a different atom. In some embodiments, the heteroatom is O, N, S, or combinations thereof.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "molecular weight" (of a polymer with "n" repeat units) is intended to mean the total mass of a polymeric molecule and is calculated as the sum of the mass of each constituent atom multiplied by the number of atoms of that element in the polymeric formula. The practical upper limit of n is determined in part by the desired solubility of a compound in a particular solvent or class of solvents. As the value of n increases, the molecular weight of the compound increases.

The term "monomeric unit" is intended to mean a repeating unit in a polymer. It represents the largest constitutional unit contributed by a single monomer to the structure of a polymer.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "polymer" is intended to mean a material having at least one repeating monomeric unit. The term includes homopolymers having only one kind of monomeric unit, and copolymers having two or more different monomeric units. Copolymers are a subset of polymers.

The term "siloxane" refers to the group $R_3SiOR_2Si-$, where R is the same or different at each occurrence and is H, D, $C_{1-20}$ alkyl, deuterated alkyl, fluoroalkyl, aryl, or deuterated aryl. In some embodiments, one or more carbons in an R alkyl group are replaced with Si.

The term "siloxy" refers to the group $R_3SiO-$, where R is the same or different at each occurrence and is H, D, $C_{1-20}$ alkyl, deuterated alkyl, fluoroalkyl, aryl, or deuterated aryl.

The term "silyl" refers to the group $R_3Si-$, where R is the same or different at each occurrence and is H, D, $C_{1-20}$ alkyl, deuterated alkyl, fluoroalkyl, aryl, or deuterated aryl. In some embodiments, one or more carbons in an R alkyl group are replaced with Si.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxane, thioalkoxy, —S(O)$_2$—N(R')(R"), —C(=O)—N(R')(R"), (R')(R")N-alkyl, (R')(R")N-alkoxy-alkyl, (R')(R")N-alkylaryloxyalkyl, —S(O)S-aryl (where s=0-2) or —S(O)S-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

In a structure where a substituent bond passes through one or more rings as shown below,

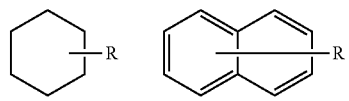

it is meant that the substituent R may be bonded at any available position on the one or more rings.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC Handbook of Chemistry and Physics, 81st Edition (2000-2001).

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each $sp^3$ carbon atom is assumed to have enough bonded hydrogen atoms in order to give it a total of four bonds; each $sp^2$ carbon, three bonds; each sp carbon, two bonds. The depiction of Formula II herein is an example of the use of the line-angle formula convention.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Compound of Formula I

In some embodiments, the hole transport compound has Formula I

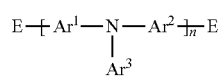

Formula I wherein:
  $Ar^1$-$Ar^3$ are selected from the group consisting of aryl groups and deuterated aryl groups, with the proviso that $Ar^1$ is not the same as $Ar^2$;
  E is the same or different at each occurrence and is selected from the group consisting of H, D, halide, alkyl, aryl, siloxane, deuterated alkyl, deuterated aryl, deuterated siloxane, and a crosslinking group; and
  n is an integer greater than or equal to 1.

As used herein, the term "hole transport compound having Formula I" is intended to designate a compound based on a repeat unit, or monomer, as defined by Formula I. Polymerization sites are the aryl halide groups attached to the amine nitrogen center within each monomer. Because of the proviso that $Ar^1$ is not the same as $Ar^2$, this class of materials leads to monomers of AB type and generates polymeric hole transport films with a random distribution of AA, BB, and AB segments throughout the polymer. This can result in differential degrees of non-associative packing that ultimately determines the associated film-forming properties. In some embodiments, the distribution of monomeric segments can be manipulated so as to optimize properties of compounds having Formula I for use in electronic devices.

In some embodiments, the hole transport compound having Formula I is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. The "% deuterated" or "% deuteration" is meant to indicate the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

In some embodiments of Formula I, n=1.
In some embodiments of Formula I, n=2-5.
In some embodiments of Formula I, n>5.
In some embodiments of Formula I, n=6-10.
In some embodiments of Formula I, the compound is a polymer with n>10. In some embodiments of Formula I, the compound is a polymer with n>100. In some embodiments, the compound is a polymer with Mn>20,000; in some embodiments, Mn>50,000; in some embodiments, Mn>100,000; in some embodiments, Mn>150,000.

In some embodiments of Formula I, E is H or D.
In some embodiments of Formula I, E is D.
In some embodiments of Formula I, E is a halogen. In some embodiments the halogen is Cl or Br; in some embodiments, Br.

In some embodiments of Formula I, E is an aryl or deuterated aryl group; in some embodiments the aryl group is substituted; in some embodiments, the aryl group is unsubstituted.

In some embodiments of Formula I, E is a monocyclic aryl group or deuterated monocyclic aryl group.

In some embodiments of Formula I, E is an aryl group with multiple rings fused together. In some embodiments the multiple rings fused together include deuterium.

In some embodiments of Formula I, E is a heteroaryl group or deuterated heteroaryl group.

In some embodiments of Formula I, E is a siloxane group or deuterated siloxane group.

In some embodiments of Formula I, E is further substituted with additional groups that may or may not include deuterium.

In some embodiments of Formula I, E is a crosslinking group.

In some embodiments of Formula I, $Ar^1$-$Ar^3$ are aryl groups that are further substituted with additional groups that may or may not include deuterium.

In some embodiments of Formula I, $Ar^1$-$Ar^3$ are hydrocarbon aryl groups.

In some embodiments of Formula I, $Ar^1$-$Ar^3$ are heteroaryl groups.

In some embodiments of Formula I, $Ar^1$-$Ar^3$ are both hydrocarbon aryl groups and heteroaryl groups.

In some embodiments of Formula I, $Ar^1$ has Formula 1a:

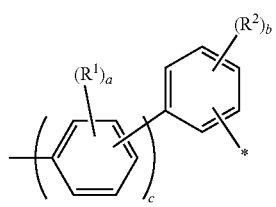

Formula 1a wherein:
- $R^1$ and $R^2$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;
- a and b are the same or different at each occurrence and are an integer from 0-4;
- c is an integer greater than or equal to 0;
- * indicates the point of attachment to E.

In some embodiments of Formula I, $Ar^1$ has Formula 1a':

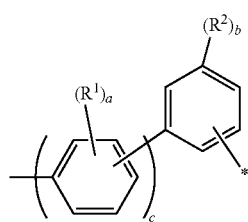

Formula 1a' where $R^1$, $R^2$, a, b, c, and * are as in Formula 1a.

In some embodiments of Formula I, $Ar^1$ has Formula 1a":

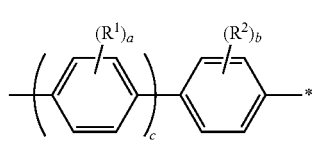

Formula 1a"

where $R^1$, $R^2$, a, b, c, and * are as in Formula 1a.

In some embodiments of Formula I, $Ar^1$ has Formula 1a.
In some embodiments of Formula I, $Ar^1$ has Formula 1a'.
In some embodiments of Formula I, $Ar^1$ has Formula 1a".
In some embodiments of Formula 1a-1a", a is not zero.
In some embodiments of Formula 1a-1a", b is not zero.
In some embodiments of Formula 1a-1a", c=1-3.
In some embodiments of Formula 1a-1a", c>4.
In some embodiments of Formula 1a-1a", a>0 and at least one $R^1$ is D or alkyl or deuterated alkyl having 1-20 carbons; in some embodiments, 1-12 carbons; in some embodiments, 3-8 carbons.

In some embodiments of Formula 1a-1a", a>0 and at least one $R^1$ is a hydrocarbon aryl group having 6-36 ring carbons. The hydrocarbon aryl group can include one or more single ring groups bonded together, one or more fused rings, or combinations thereof.

In some embodiments of Formula 1a-1a", a>0 and at least one $R^1$ has no heteroaromatic groups.

In some embodiments of Formula 1a-1a", a>0 and at least one $R^1$ is an amino or deuterated amino group.

In some embodiments of Formula 1a-1a", b>0 and at least one $R^2$ is D or alkyl or deuterated alkyl having 1-20 carbons; in some embodiments, 1-12 carbons; in some embodiments, 3-8 carbons.

In some embodiments of Formula 1a-1a", b>0 and at least one $R^2$ is a hydrocarbon aryl group having 6-36 ring carbons. The hydrocarbon aryl group can include one or more single ring groups bonded together, one or more fused rings, or combinations thereof.

In some embodiments of Formula 1a-1a", b>0 and at least one $R^2$ has no heteroaromatic groups.

In some embodiments of Formula 1a-1a", b>0 and at least one $R^2$ is an amino or deuterated amino group.

In some embodiments of Formula 1a-1a", $R^1$ and $R^2$ are the same.

In some embodiments of Formula 1a-1a", $R^1$ and $R^2$ are different.

In some embodiments of Formula I, $Ar^2$ as Formula 1b:

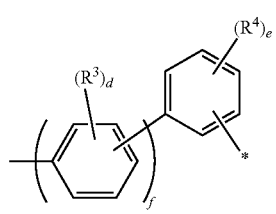

Formula 1b wherein:
- $R^3$ and $R^4$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

d and e are the same or different at each occurrence and are an integer from 0-4;

f is an integer greater than or equal to 0;

* indicates the point of attachment to E.

In some embodiments of Formula I, $Ar^2$ has Formula 1b':

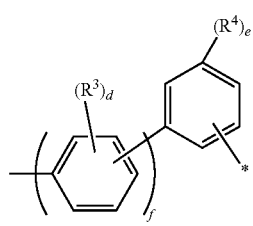

Formula 1b' where $R^3$, $R^4$, d, e, f, and * are as in Formula 1b.

In some embodiments of Formula I, $Ar^2$ has Formula 1b":

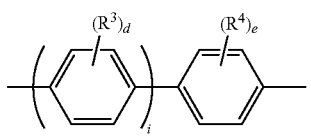

Formula 1b"

where $R^3$, $R^4$, d, e, f, and * are as in Formula 1b.

In some embodiments of Formula I, $Ar^2$ has Formula 1b.

In some embodiments of Formula I, $Ar^2$ has Formula 1b'.

In some embodiments of Formula I, $Ar^2$ has Formula 1b".

In some embodiments of Formula 1b-1b", d is not zero.

In some embodiments of Formula 1b-1b", e is not zero.

In some embodiments of Formula 1b-1b", f=1-3.

In some embodiments of Formula 1b-1b", f>4.

In some embodiments of Formula 1b-1b", d>0 and at least one $R^3$ is D or alkyl or deuterated alkyl having 1-20 carbons; in some embodiments, 1-12 carbons; in some embodiments, 3-8 carbons.

In some embodiments of Formula 1b-1b", d>0 and at least one $R^3$ is a hydrocarbon aryl group having 6-36 ring carbons. The hydrocarbon aryl group can include one or more single ring groups bonded together, one or more fused rings, or combinations thereof.

In some embodiments of Formula 1b-1b", d>0 and at least one $R^3$ has no heteroaromatic groups.

In some embodiments of Formula 1b-1b", d>0 and at least one $R^3$ is an amino or deuterated amino group.

In some embodiments of Formula 1b-1b", e>0 and at least one $R^4$ is an alkyl or deuterated alkyl having 1-20 carbons; in some embodiments, 1-12 carbons; in some embodiments, 3-8 carbons.

In some embodiments of Formula 1b-1b", e>0 and at least one $R^4$ is a hydrocarbon aryl group having 6-36 ring carbons. The hydrocarbon aryl group can include one or more single ring groups bonded together, one or more fused rings, or combinations thereof.

In some embodiments of Formula 1b-1b", e>0 and at least one $R^4$ has no heteroaromatic groups.

In some embodiments of Formula 1b-1b", e>0 and at least one $R^4$ is an amino or deuterated amino group.

In some embodiments of Formula 1b-1b", $R^3$ and $R^4$ are the same.

In some embodiments of Formula 1b-1b", $R^3$ and $R^4$ are different.

In some embodiments of Formula I, $Ar^1$ has Formula 1a and $Ar^2$ has Formula 1b.

In some embodiments of Formula I, $Ar^1$ has Formula 1a and $Ar^2$ has Formula 1b'.

In some embodiments of Formula I, $Ar^1$ has Formula 1a and $Ar^2$ has Formula 1b".

In some embodiments of Formula I, $Ar^1$ has Formula 1a' and $Ar^2$ has Formula 1b.

In some embodiments of Formula I, $Ar^1$ has Formula 1a" and $Ar^2$ has Formula 1b.

In some embodiments of Formula I, $Ar^3$ has Formula 1c:

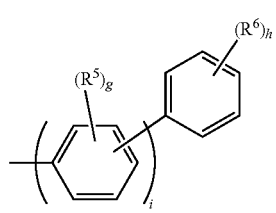

Formula 1c where:

$R^5$ and $R^6$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^5$ and $R^6$ can be joined together to form a fused ring;

g is the same or different at each occurrence and is an integer from 0-4;

h is an integer from 0-5; and i is an integer greater than or equal to 0.

In some embodiments of Formula I, $Ar^3$ has Formula 1c':

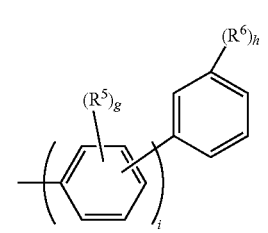

Formula 1c' where $R^5$, $R^6$, g, h, and 1 are as in Formula 1c.

In some embodiments of Formula I, Ar$^3$ has Formula 1c":

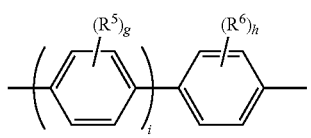

Formula 1c"

where R$^5$, R$^6$, g, h, and i are as in Formula 1c.

In some embodiments of Formula I, Ar$^3$ has Formula 1c.
In some embodiments of Formula I, Ar$^3$ has Formula 1c'.
In some embodiments of Formula I, Ar$^3$ has Formula 1c".
In some embodiments of Formula 1c-1c", g is not zero.
In some embodiments of Formula 1c-1c", h is not zero.
In some embodiments of Formula 1c-1c", i=1-3.
In some embodiments of Formula 1c-1c", i>4.

In some embodiments of Formula 1c-1c", g>0 and at least one R$^5$ is D or alkyl or deuterated alkyl having 1-20 carbons; in some embodiments, 1-12 carbons; in some embodiments, 3-8 carbons.

In some embodiments of Formula 1c-1c", g>0 and at least one R$^5$ is a hydrocarbon aryl group having 6-36 ring carbons. The hydrocarbon aryl group can include one or more single ring groups bonded together, one or more fused rings, or combinations thereof.

In some embodiments of Formula 1c-1c", g>0 and at least one R$^5$ has no heteroaromatic groups.

In some embodiments of Formula 1c-1c", g>0 and at least one R$^5$ is an amino or deuterated amino group.

In some embodiments of Formula 1c-1c", R$^5$ and R$^6$ are the same.

In some embodiments of Formula 1c-1c", R$^5$ and R$^6$ are different.

In some embodiments of Formula 1c-1c", h>0 and at least one R$^6$ is D or alkyl or deuterated alkyl having 1-20 carbons; in some embodiments, 1-12 carbons; in some embodiments, 3-8 carbons.

In some embodiments of Formula 1c-1c", h>0 and at least one R$^6$ is a hydrocarbon aryl group having 6-36 ring carbons. The hydrocarbon aryl group can include one or more single ring groups bonded together, one or more fused rings, or combinations thereof.

In some embodiments of Formula 1c-1c", h>0 and at least one R$^6$ has no heteroaromatic groups.

In some embodiments of Formula 1c-1c", h>0 and at least one R$^6$ is an amino or deuterated amino group.

Any of the above embodiments for Formula I can be combined with one or more of the other embodiments, so long as they are not mutually exclusive. For example, the embodiment in which Ar$^1$ has Formula 1a' can be combined with the embodiment in which Ar$^2$ has Formula 1b". The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula I are shown below.

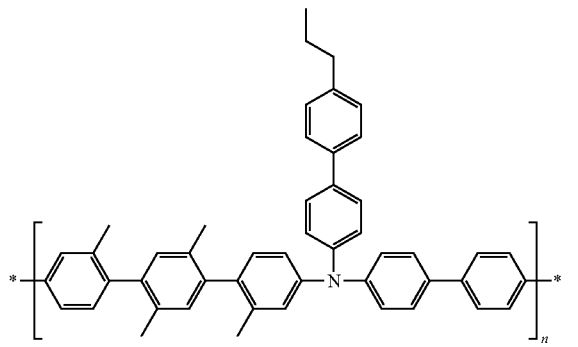

Compound HTI-A

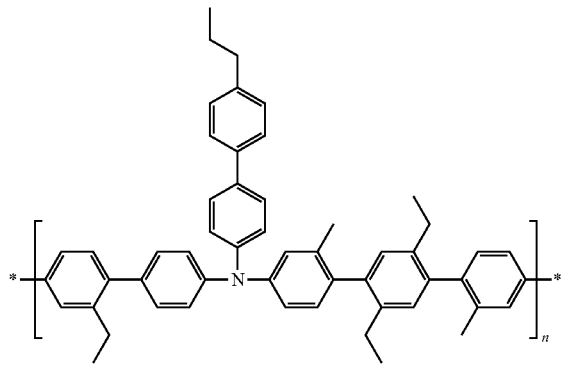

Compound HTI-B

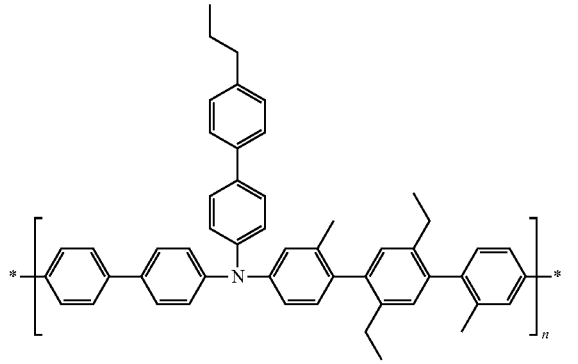

Compound HTI-C

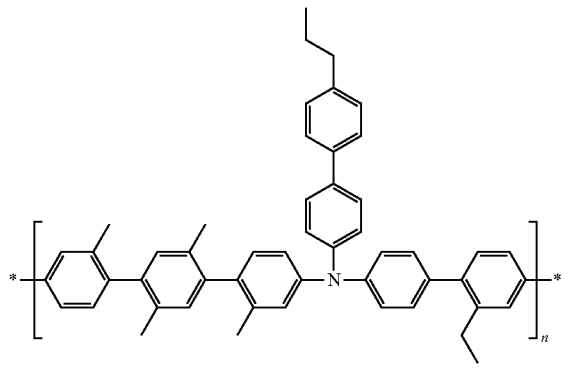

Compoutnd HTI-D

Compound HTI-E

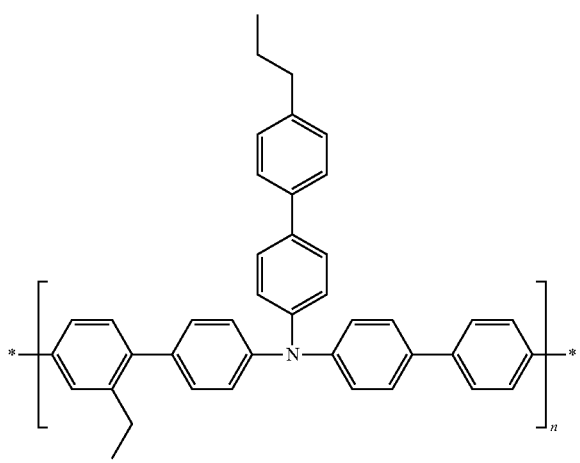

The new monomers and polymers can be made using any technique that will yield a C—C or C—N bond. A variety of such techniques are known, such as Suzuki, Yamamoto, Stille, and Pd- or Ni-catalyzed C—N couplings. Deuterated compounds can be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum dichloride. Exemplary preparations are given in the Examples.

The compounds can be formed into layers using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The new compounds having Formula I can be used as hole transport materials and as hosts for electroluminescent materials. The new compounds also have utility in one or more layers between the hole injection layer and the hole transport layer.

3. Compound of Formula II

In some embodiments, the hole transport compound has Formula II wherein:
Ar$^4$-Ar$^7$ are the same or different and are aryl groups or deuterated aryl groups;
E$^1$ is the same or different at each occurrence and is selected from the group consisting of H, D, halide, alkyl, aryl, siloxane, deuterated alkyl, deuterated aryl, deuterated siloxane, and a crosslinking group;
R$^1$-R$^5$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R$^1$-R$^5$ can be joined together to form a fused ring;
a-e are the same or different and are in integer from 0-4;
m is an integer from 0-6;
o is an integer greater than or equal to 1;
with the proviso that at least two of a-e are greater than zero and at least two of R$^1$-R$^5$ are not D.

As used herein, the term "hole transport compound having Formula II" is intended to designate a compound based on a repeat unit, or monomer, as defined by Formula II. Polymerization sites are the aryl halide groups attached to the amine nitrogen centers within each monomer. Because of the nonsymmetrical substitution pattern of the four phenyl groups in Formula II, this class of materials leads to monomers of AB type and generates polymeric hole transport films with a random distribution of AA, BB, and AB segments throughout the polymer. This can result in differential degrees of non-associative packing that ultimately determines the associated film-forming properties. In some embodiments, the distribution of monomeric segments can be manipulated so as to optimize properties of compounds having Formula II for use in electronic devices.

In some embodiments, the hole transport compound having Formula II is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. The "% deuterated" or "% deuteration" is meant to indicate the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some Formula II

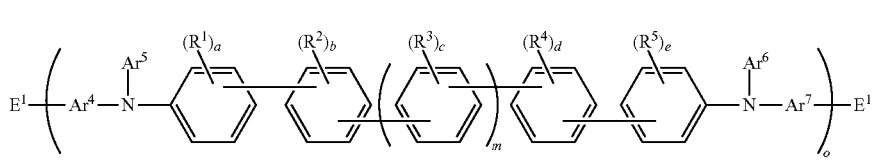

embodiments, at least 80% deuterated; in some embodiments, at least 90% deuterated; in some embodiments, 100% deuterated.

Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

In some embodiments of Formula II, o=1.

In some embodiments of Formula II, o=2-5.

In some embodiments of Formula II, o>5.

In some embodiments of Formula II, o=6-10.

In some embodiments of Formula II, the compound is a polymer with o>10.

In some embodiments of Formula II, the compound is a polymer with o>100.

In some embodiments of Formula II, the compound is a polymer with Mn>20,000; in some embodiments Mn>50,000, in some embodiments Mn>100,000, in some embodiments Mn>150,000.

In some embodiments of Formula II, $E^1$ is H or D.

In some embodiments of Formula II, $E^1$ is D.

In some embodiments of Formula II, $E^1$ is a halogen. In some embodiments the halogen is Cl or Br; in some embodiments, Br.

In some embodiments of Formula II, $E^1$ is an aryl or deuterated aryl group; in some embodiments the aryl group is substituted; in some embodiments, the aryl group is unsubstituted.

In some embodiments of Formula II, $E^1$ is a monocyclic aryl group or deuterated monocyclic aryl group.

In some embodiments of Formula II, $E^1$ is an aryl group with multiple rings fused together. In some embodiments the multiple rings fused together include deuterium.

In some embodiments of Formula II, $E^1$ is a heteroaryl group or deuterated heteroaryl group.

In some embodiments of Formula II, $E^1$ is a siloxane group or deuterated siloxane group.

In some embodiments of Formula II, $E^1$ is further substituted with additional groups that may or may not include deuterium.

In some embodiments of Formula II, $E^1$ is a crosslinking group.

In some embodiments of Formula II, $Ar^4$-$Ar^7$ are aryl groups that are further substituted with additional groups that may or may not include deuterium.

In some embodiments of Formula II, $Ar^4$-$Ar^7$ are hydrocarbon aryl groups.

In some embodiments of Formula II, $Ar^4$-$Ar^7$ are heteroaryl groups.

In some embodiments of Formula II, $Ar^4$-$Ar^7$ are hydrocarbon aryl groups and heteroaryl groups.

In some embodiments of Formula II, $Ar^4$ or $Ar^7$ have Formula 1a:

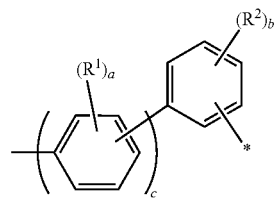

Formula 1a wherein:
$R^1$ and $R^2$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

a and b are the same or different at each occurrence and are an integer from 0-4;

c is an integer greater than or equal to 0;

* indicates the point of attachment to $E^1$.

In some embodiments of Formula II, $Ar^4$ or $Ar^7$ have Formula 1a':

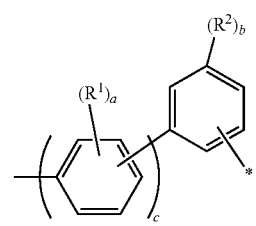

Formula 1a' where $R^1$, $R^2$, a, b, c, and * are as in Formula 1a.

In some embodiments of Formula II, $Ar^4$ or $Ar^7$ have Formula 1a":

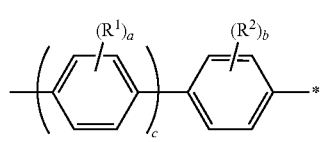

Formula 1a"

where $R^1$, $R^2$, a, b, c, and * are as in Formula 1a.

In some embodiments of Formula II, $Ar^4$ or $Ar^7$ have Formula 1a.

In some embodiments of Formula II, $Ar^4$ or $Ar^7$ have Formula 1a'.

In some embodiments of Formula II, $Ar^4$ or $Ar^7$ have Formula 1a".

In some embodiments of Formula 1a-1a", a is not zero.

In some embodiments of Formula 1a-1a", b is not zero.

In some embodiments of Formula 1a-1a", c=1-3.

In some embodiments of Formula 1a-1a", c>4.

In some embodiments of Formula 1a-1a", a>0 and at least one $R^1$ is D or alkyl or deuterated alkyl having 1-20 carbons; in some embodiments, 1-12 carbons; in some embodiments, 3-8 carbons.

In some embodiments of Formula 1a-1a", a>0 and at least one $R^1$ is a hydrocarbon aryl group having 6-36 ring carbons. The hydrocarbon aryl group can include one or more single ring groups bonded together, one or more fused rings, or combinations thereof.

In some embodiments of Formula 1a-1a", a>0 and at least one $R^1$ has no heteroaromatic groups.

In some embodiments of Formula 1a-1a", a>0 and at least one $R^1$ is an amino or deuterated amino group.

In some embodiments of Formula 1a-1a", b>0 and at least one $R^2$ is D or alkyl or deuterated alkyl having 1-20 carbons; in some embodiments, 1-12 carbons; in some embodiments, 3-8 carbons.

In some embodiments of Formula 1a-1a", b>0 and at least one $R^2$ is a hydrocarbon aryl group having 6-36 ring carbons. The hydrocarbon aryl group can include one or more single ring groups bonded together, one or more fused rings, or combinations thereof.

In some embodiments of Formula 1a-1a", b>0 and at least one $R^2$ has no heteroaromatic groups.

In some embodiments of Formula 1a-1a", b>0 and at least one $R^2$ is an amino or deuterated amino group.

In some embodiments of Formula 1a-1a", $R^1$ and $R^2$ are the same.

In some embodiments of Formula 1a-1a", $R^1$ and $R^2$ are different.

In some embodiments of Formula II, $Ar^4=Ar^7$.

In some embodiments of Formula II, $Ar^4 \neq Ar^7$.

In some embodiments of Formula II, $Ar^5$ or $A^6$ have Formula 1c:

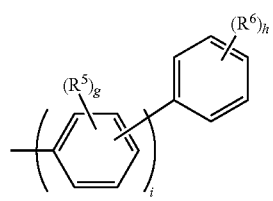

Formula 1c where:
R$^5$ and R$^6$ are the same or different at each occurrence and selected from the group consisting of D, F, CN, alkyl, fluoroalkyl, aryl, heteroaryl, amino, sityl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R$^5$ and R$^6$ can be joined together to form a fused ring;

g is the same or different at each occurrence and is an integer from 0-4;

h is an integer from 0-5; and i is an integer greater than or equal to 0.

In some embodiments of Formula II, $Ar^5$ or $Ar^6$ have Formula 1c':

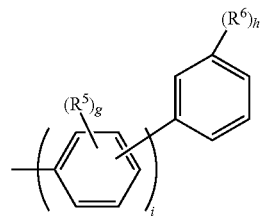

Formula 1c' where $R^5$, $R^6$, g, h, and 1 are as in Formula 1c.

In some embodiments of Formula II, $Ar^5$ or $Ar^6$ have Formula 1c":

Formula 1c"

where $R^5$, $R^6$, g, h, and i are as in Formula 1c.

In some embodiments of Formula II, Ar5 or Ar6 have Formula 1c.

In some embodiments of Formula II, Ar5 or Ar6 have Formula 1c'.

In some embodiments of Formula II, Ar5 or Ar6 has Formula 1c".

In some embodiments of Formula 1c-1c", g is not zero.

In some embodiments of Formula 1c-1c", h is not zero.

In some embodiments of Formula 1c-1c", i=1-3.

In some embodiments of Formula 1c-1c", i>4.

In some embodiments of Formula 1c-1c", g>0 and at least one $R^5$ is D or alkyl or deuterated alkyl having 1-20 carbons; in some embodiments, 1-12 carbons; in some embodiments, 3-8 carbons.

In some embodiments of Formula 1c-1c", g>0 and at least one $R^5$ is a hydrocarbon aryl group having 6-36 ring carbons. The hydrocarbon aryl group can include one or more single ring groups bonded together, one or more fused rings, or combinations thereof.

In some embodiments of Formula 1c-1c", g>0 and at least one $R^5$ has no heteroaromatic groups.

In some embodiments of Formula 1c-1c", g>0 and at least one $R^5$ is an amino or deuterated amino group.

In some embodiments of Formula 1c-1c", $R^5$ and $R^6$ are the same.

In some embodiments of Formula 1c-1c", $R^5$ and $R^6$ are different.

In some embodiments of Formula 1c-1c", h>0 and at least one $R^6$ is D or alkyl or deuterated alkyl having 1-20 carbons; in some embodiments, 1-12 carbons; in some embodiments, 3-8 carbons.

In some embodiments of Formula 1c-1c", h>0 and at least one $R^6$ is a hydrocarbon aryl group having 6-36 ring carbons. The hydrocarbon aryl group can include one or more single ring groups bonded together, one or more fused rings, or combinations thereof.

In some embodiments of Formula 1c-1c", h>0 and at least one $R^6$ has no heteroaromatic groups.

In some embodiments of Formula 1c-1c", h>0 and at least one $R^6$ is an amino or deuterated amino group.

In some embodiments of Formula 1c-1c", $R^5$ and $R^6$ are the same.

In some embodiments of Formula 1c-1c", $R^5$ and $R^6$ are different.

In some embodiments of Formula II, $Ar^5$-$Ar^6$.

In some embodiments of Formula II, $Ar^5 \neq Ar^6$.

In some embodiments of Formula II, a=0.

In some embodiments of Formula II, a=1.

In some embodiments of Formula II, a=2.

In some embodiments of Formula II, a=3.

In some embodiments of Formula II, a=4.

In some embodiments of Formula II, a>0 and $R^1$ is D or $C_{1-10}$ alkyl. In some embodiments, the alkyl group is deuterated.

In some embodiments of Formula II, a>0 and $R^1$ is $C_{1-10}$ silyl. In some embodiments, the silyl group is deuterated.

In some embodiments of Formula II, a>0 and $R^1$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula II, a>0 and $R^1$ is an amino group. In some embodiments, the amino group is deuterated.

In some embodiments of Formula II, a=4 and $R^1$=D.

In some embodiments of Formula II, b=0.

In some embodiments of Formula II, b=1.

In some embodiments of Formula II, b=2.

In some embodiments of Formula II, b=3.

In some embodiments of Formula II, b=4.

In some embodiments of Formula II, b>0 and $R^2$ is D or $C_{1-10}$ alkyl. In some embodiments, the alkyl group is deuterated.

In some embodiments of Formula II, b>0 and $R^2$ is $C_{1-10}$ silyl. In some embodiments, the silyl group is deuterated.

In some embodiments of Formula II, b>0 and $R^2$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula II, b>0 and $R^2$ is an amino group. In some embodiments, the amino group is deuterated.

In some embodiments of Formula II, b=4 and $R^2$=D.

In some embodiments of Formula II, c=0.

In some embodiments of Formula II, c=1.

In some embodiments of Formula II, c=2.

In some embodiments of Formula II, c=3.

In some embodiments of Formula II, c=4.

In some embodiments of Formula II, c>0 and $R^3$ is D or $C_{1-10}$ alkyl. In some embodiments, the alkyl group is deuterated.

In some embodiments of Formula II, c>0 and $R^3$ is $C_{1-10}$ silyl. In some embodiments, the silyl group is deuterated.

In some embodiments of Formula II, c>0 and $R^3$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula II, c>0 and $R^3$ is an amino group. In some embodiments, the amino group is deuterated.

In some embodiments of Formula II, c=4 and $R^3$=D.

In some embodiments of Formula II, d=0.

In some embodiments of Formula II, d=1.

In some embodiments of Formula II, d=2.

In some embodiments of Formula II, d=3.

In some embodiments of Formula II, d=4.

In some embodiments of Formula II, d>0 and $R^4$ is D or $C_{1-10}$ alkyl. In some embodiments, the alkyl group is deuterated.

In some embodiments of Formula II, d>0 and $R^4$ is $C_{1-10}$ silyl. In some embodiments, the silyl group is deuterated.

In some embodiments of Formula II, d>0 and $R^4$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula II, d>0 and $R^4$ is an amino group. In some embodiments, the amino group is deuterated.

In some embodiments of Formula II, d=4 and $R^4$=D.

In some embodiments of Formula II, e=0.

In some embodiments of Formula II, e=1.

In some embodiments of Formula II, e=2.

In some embodiments of Formula II, e=3.

In some embodiments of Formula II, e=4.

In some embodiments of Formula II, e>0 and $R^5$ is D or $C_{1-10}$ alkyl. In some embodiments, the alkyl group is deuterated.

In some embodiments of Formula II, e>0 and $R^5$ is $C_{1-10}$ silyl. In some embodiments, the silyl group is deuterated.

In some embodiments of Formula II, e>0 and $R^5$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula II, e>0 and $R^5$ is an amino group. In some embodiments, the amino group is deuterated.

In some embodiments of Formula II, e=4 and $R^5$=D.

In some embodiments of Formula II, m=0.

In some embodiments of Formula II, m=1.

In some embodiments of Formula II, m=2.

In some embodiments of Formula II, m=3.

In some embodiments of Formula II, m=4.

In some embodiments of Formula II, m=5.

In some embodiments of Formula II, m=6.

In some embodiments of Formula II, m=0 and two of a-e are greater than zero and two of $R^1$-$R^5$ are not D.

In some embodiments of Formula II, m=0 and three of a-e are greater than zero and three of $R^1$-$R^5$ are not D.

In some embodiments of Formula II, m=0 and four of a-e are greater than zero and four of $R^1$-$R^5$ are not D.

In some embodiments of Formula II, m=1 and two of a-e are greater than zero and two of $R^1$-$R^5$ are not D.

In some embodiments of Formula II, m=1 and three of a-e are greater than zero and three of $R^1$-$R^5$ are not D.

In some embodiments of Formula II, m=1 and four of a-e are greater than zero and four of $R^1$-$R^5$ are not D.

In some embodiments of Formula II, m=1 and five of a-e are greater than zero and five of $R^1$-$R^5$ are not D.

In some embodiments of Formula II, m=2 and two of a-e are greater than zero and two of $R^1$-$R^5$ are not D.

In some embodiments of Formula II, m=2 and three of a-e are greater than zero and three of $R^1$-$R^5$ are not D.

In some embodiments of Formula II, m=2 and four of a-e are greater than zero and four of $R^1$-$R^5$ are not D.

In some embodiments of Formula II, m=2 and five of a-e are greater than zero and five of $R^1$-$R^5$ are not D.

In some embodiments of Formula II, m=2 and six of a-e are greater than zero and six of $R^1$-$R^5$ are not D.

In some embodiments of Formula II, m>2 and two or more of a-e are greater than zero and $R^1$-$R^5$ corresponding to non-zero a-e are not D.

Any of the above embodiments for Formula II can be combined with one or more of the other embodiments, so long as they are not mutually exclusive. For example, the embodiment in which Ar⁴ has Formula 1a can be combined with the embodiment in which Ar⁵ has Formula 1c'. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula II are shown below.

The new monomers and polymers can be made using any technique that will yield a C—C or C—N bond. A variety of such techniques are known, such as Suzuki, Yamamoto, Stille, and Pd- or Ni-catalyzed C—N couplings. Deuterated compounds can be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum dichloride. Exemplary preparations are given in the Examples.

The compounds can be formed into layers using solution processing techniques. The term "layer" is used interchange-

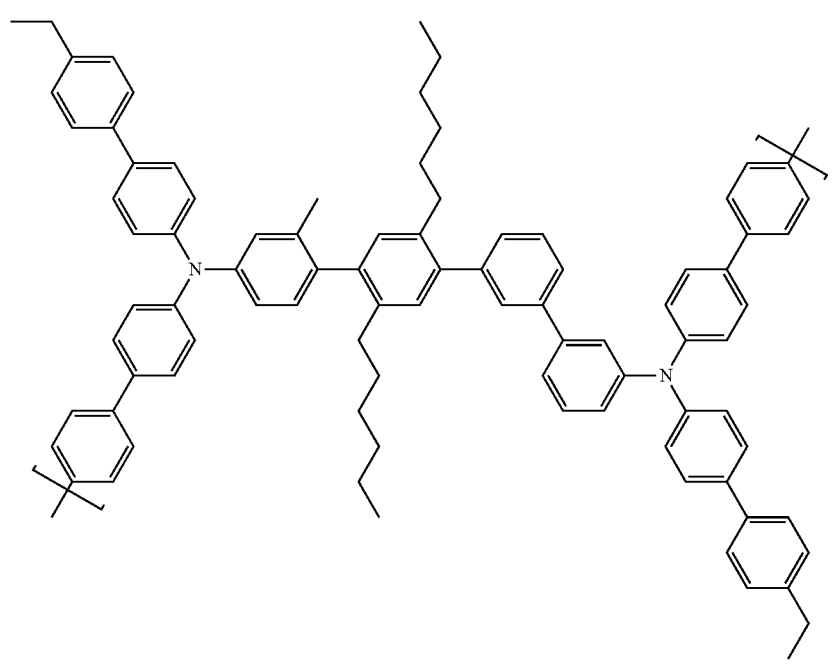

Compound HTII-A

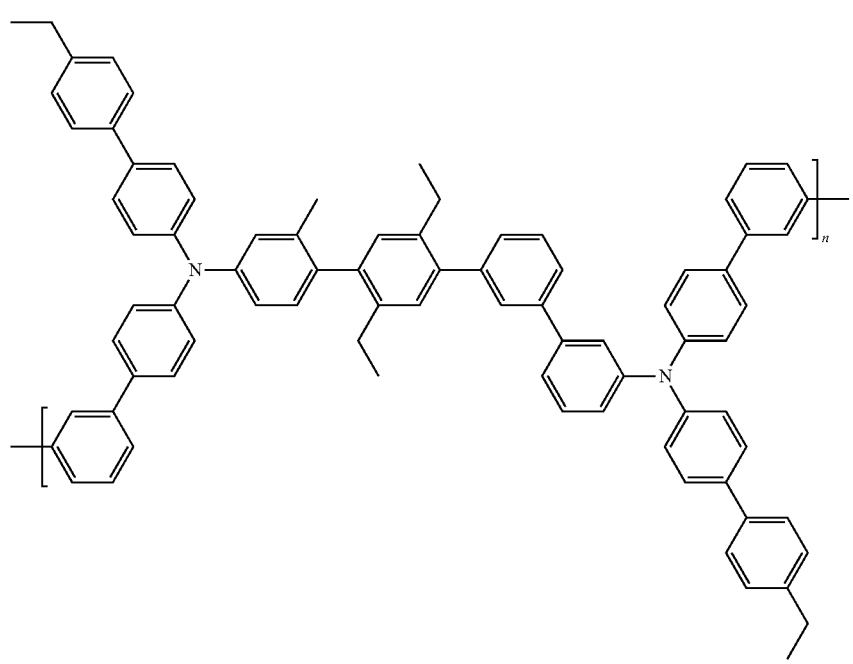

Compound HTII-B ably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The new compounds having Formula II can be used as hole transport materials and as hosts for electroluminescent materials. The new compounds also have utility in one or more layers between the hole injection layer and the hole transport layer.

4. Compound of Formula IIa

In some embodiments, the hole transport compound has Formula IIa embodiments, the distribution of monomeric segments can be manipulated so as to optimize properties of compounds having Formula II for use in electronic devices.

In some embodiments, the hole transport compound having Formula IIa is deuterated. The term "deuterated" is intended to mean that at least one H has been replaced by deuterium ("D"). The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the compound is at least 10% deuterated. The "% deuterated" or "% deuteration" is meant to indicate the ratio of deuterons to the sum of protons plus deuterons, expressed as a percentage. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Formula IIa

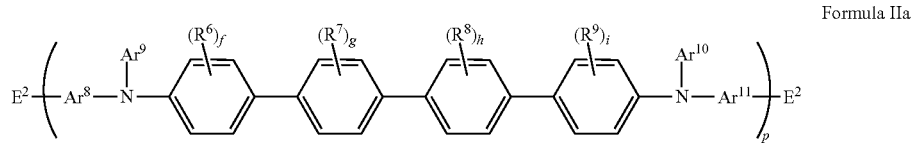

wherein:
- $Ar^8$-$Ar^{11}$ are the same or different and are aryl groups or deuterated aryl groups;
- $E^2$ is the same or different at each occurrence and is selected from the group consisting of H, D, halide, alkyl, aryl, siloxane, deuterated alkyl, deuterated aryl, deuterated siloxane, and a crosslinking group;
- $R^6$-$R^9$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$-$R^5$ can be joined together to form a fused ring;
- f-i are the same or different and are in integer from 0-4;
- p is an integer greater than or equal to 1;

with the proviso that at least two of f-i are greater than zero and at least two of $R^6$-$R^9$ are not D.

As used herein, the term "hole transport compound having Formula IIa" is intended to designate a compound based on a repeat unit, or monomer, as defined by Formula IIa. Polymerization sites are the aryl halide groups attached to the amine nitrogen centers within each monomer. Because of the nonsymmetrical substitution pattern of the four phenyl groups in Formula IIa, this class of materials leads to monomers of AB type and generates polymeric hole transport films with a random distribution of AA, BB, and AB segments throughout the polymer. This can result in differential degrees of non-associative packing that ultimately determines the associated film-forming properties. In some Deuterated materials can be less susceptible to degradation by holes, electrons, excitons, or a combination thereof. Deuteration can potentially inhibit degradation of the compound during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

In some embodiments of Formula IIa, p=1.
In some embodiments of Formula IIa, p=2-5.
In some embodiments of Formula IIa, p>5.
In some embodiments of Formula IIa, p=6-10.
In some embodiments of Formula IIa, the compound is a polymer with p>10.
In some embodiments of Formula IIa, the compound is a polymer with p>100.
In some embodiments of Formula IIa, the compound is a polymer with Mn>20,000; in some embodiments Mn>50,000, in some embodiments Mn>100,000, in some embodiments Mn>150,000.
In some embodiments of Formula IIa, $E^2$ is H or D.
In some embodiments of Formula IIa, $E^2$ is D.
In some embodiments of Formula IIa, $E^2$ is a halogen. In some embodiments the halogen is Cl or Br; in some embodiments, Br.
In some embodiments of Formula IIa, $E^2$ is an aryl or deuterated aryl group; in some embodiments the aryl group is substituted; in some embodiments, the aryl group is unsubstituted.
In some embodiments of Formula IIa, $E^2$ is a monocyclic aryl group or deuterated monocyclic aryl group.

In some embodiments of Formula IIa, E² is an aryl group with multiple rings fused together. In some embodiments the multiple rings fused together include deuterium.

In some embodiments of Formula IIa, E² is a heteroaryl group or deuterated heteroaryl group.

In some embodiments of Formula IIa, E² is a siloxane group or deuterated siloxane group.

In some embodiments of Formula IIa, E² is further substituted with additional groups that may or may not include deuterium.

In some embodiments of Formula IIa, E² is a crosslinking group.

In some embodiments of Formula IIa, Ar⁸-Ar¹¹ are aryl groups that are further substituted with additional groups that may or may not include deuterium.

In some embodiments of Formula I, Ar⁸-Ar¹¹ are hydrocarbon aryl groups.

In some embodiments of Formula IIa, Ar⁸-Ar¹¹ are heteroaryl groups.

In some embodiments of Formula IIa, Ar⁸-Ar¹¹ are hydrocarbon aryl groups and heteroaryl groups.

In some embodiments of Formula IIa, Ar⁸ or Ar¹¹ have Formula 1a:

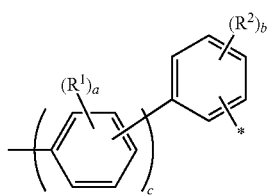

Formula 1a wherein:
R¹ and R² are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R¹ and R² can be joined together to form a fused ring;
a and b are the same or different at each occurrence and are an integer from 0-4;
c is an integer greater than or equal to 0;
* indicates the point of attachment to E².

In some embodiments of Formula IIa, Ar⁸ or Ar¹¹ have Formula 1a':

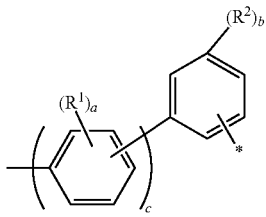

Formula 1a' where R¹, R², a, b, c, and * are as in Formula 1a.

In some embodiments of Formula IIa, Ar⁸ or Ar¹¹ have Formula 1a":

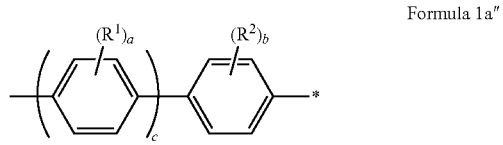

Formula 1a"

where R¹, R², a, b, c, and * are as in Formula 1a.

In some embodiments of Formula IIs, Ar⁸ or Ar¹¹ have Formula 1a.

In some embodiments of Formula IIa, Ar⁸ or Ar¹¹ have Formula 1a'.

In some embodiments of Formula IIa, Ar⁸ or Ar¹¹ have Formula 1a".

In some embodiments of Formula 1a-1a", a is not zero.
In some embodiments of Formula 1a-1a", b is not zero.
In some embodiments of Formula 1a-1a", c=1-3.
In some embodiments of Formula 1a-1a", c>4.
In some embodiments of Formula 1a-1a", a>0 and at least one R¹ is D or alkyl or deuterated alkyl having 1-20 carbons; in some embodiments, 1-12 carbons; in some embodiments, 3-8 carbons.

In some embodiments of Formula 1a-1a", a>0 and at least one R¹ is a hydrocarbon aryl group having 6-36 ring carbons. The hydrocarbon aryl group can include one or more single ring groups bonded together, one or more fused rings, or combinations thereof.

In some embodiments of Formula 1a-1a", a>0 and at least one R¹ has no heteroaromatic groups.

In some embodiments of Formula 1a-1a", a>0 and at least one R¹ is an amino or deuterated amino group.

In some embodiments of Formula 1a-1a", b>0 and at least one R² is D or alkyl or deuterated alkyl having 1-20 carbons; in some embodiments, 1-12 carbons; in some embodiments, 3-8 carbons.

In some embodiments of Formula 1a-1a", b>0 and at least one R² is a hydrocarbon aryl group having 6-36 ring carbons. The hydrocarbon aryl group can include one or more single ring groups bonded together, one or more fused rings, or combinations thereof.

In some embodiments of Formula 1a-1a", b>0 and at least one R² has no heteroaromatic groups.

In some embodiments of Formula 1a-1a", b>0 and at least one R² is an amino or deuterated amino group.

In some embodiments of Formula 1a-1a", R¹ and R² are the same.

In some embodiments of Formula 1a-1a", R¹ and R² are different.

In some embodiments of Formula IIa, Ar⁸=Ar¹¹.
In some embodiments of Formula IIa, Ar⁸≠Ar¹¹.
In some embodiments of Formula IIa, Ar⁹ or Ar¹⁰ have Formula 1c:

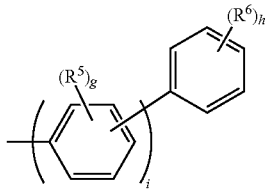

Formula 1c where:
R⁵ and R⁶ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^5$ and $R^6$ can be joined together to form a fused ring;

g is the same or different at each occurrence and is an integer from 0-4;

h is an integer from 0-5; and i is an integer greater than or equal to 0.

In some embodiments of Formula IIa, $Ar^9$ or $Ar^{19}$ have Formula 1c':

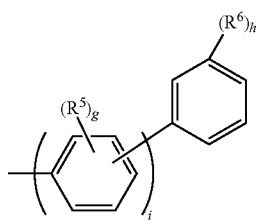

Formula 1c' where $R^5$, $R^6$, g, h, and 1 are as in Formula 1c.

In some embodiments of Formula IIa, $Ar^9$ or $Ar^{19}$ have Formula 1c":

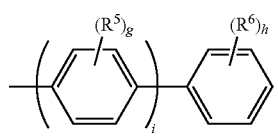

Formula 1c"

where $R^5$, $R^6$, g, h, and i are as in Formula 1c.

In some embodiments of Formula IIa, $Ar^9$ or $Ar^{19}$ have Formula 1c.

In some embodiments of Formula IIa, $Ar^9$ or $Ar^{19}$ have Formula 1c'.

In some embodiments of Formula IIa, $Ar^9$ or $Ar^{19}$ has Formula 1c".

In some embodiments of Formula 1c-1c", g is not zero.

In some embodiments of Formula 1c-1c", h is not zero.

In some embodiments of Formula 1c-1c", i=1-3.

In some embodiments of Formula 1c-1c", i>4.

In some embodiments of Formula 1c-1c", g>0 and at least one $R^5$ is D or alkyl or deuterated alkyl having 1-20 carbons; in some embodiments, 1-12 carbons; in some embodiments, 3-8 carbons.

In some embodiments of Formula 1c-1c", g>0 and at least one $R^5$ is a hydrocarbon aryl group having 6-36 ring carbons. The hydrocarbon aryl group can include one or more single ring groups bonded together, one or more fused rings, or combinations thereof.

In some embodiments of Formula 1c-1c", g>0 and at least one $R^5$ has no heteroaromatic groups.

In some embodiments of Formula 1c-1c", g>0 and at least one $R^5$ is an amino or deuterated amino group.

In some embodiments of Formula 1c-1c", $R^5$ and $R^6$ are the same.

In some embodiments of Formula 1c-1c", $R^5$ and $R^6$ are different.

In some embodiments of Formula 1c-1c", h>0 and at least one $R^6$ is D or alkyl or deuterated alkyl having 1-20 carbons; in some embodiments, 1-12 carbons; in some embodiments, 3-8 carbons.

In some embodiments of Formula 1c-1c", h>0 and at least one $R^6$ is a hydrocarbon aryl group having 6-36 ring carbons. The hydrocarbon aryl group can include one or more single ring groups bonded together, one or more fused rings, or combinations thereof.

In some embodiments of Formula 1c-1c", h>0 and at least one $R^6$ has no heteroaromatic groups.

In some embodiments of Formula 1c-1c", h>0 and at least one $R^6$ is an amino or deuterated amino group.

In some embodiments of Formula 1c-1c", $R^5$ and $R^6$ are the same.

In some embodiments of Formula 1c-1c", $R^5$ and $R^6$ are different.

In some embodiments of Formula IIa, $Ar^9=Ar^{10}$.

In some embodiments of Formula IIa, $Ar^9 \neq Ar^{10}$.

In some embodiments of Formula IIa, f=0.

In some embodiments of Formula IIa, f=1.

In some embodiments of Formula IIa, f=2.

In some embodiments of Formula IIa, f=3.

In some embodiments of Formula IIa, f=4.

In some embodiments of Formula IIa, f>0 and $R^6$ is D or $C_{1-10}$ alkyl. In some embodiments, the alkyl group is deuterated.

In some embodiments of Formula IIa, f>0 and $R^6$ is $C_{1-10}$ silyl. In some embodiments, the silyl group is deuterated.

In some embodiments of Formula IIa, f>0 and $R^6$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula IIa, f>0 and $R^6$ is an amino group. In some embodiments, the amino group is deuterated.

In some embodiments of Formula IIa, f=4 and $R^6$=D.

In some embodiments of Formula IIa, g=0.

In some embodiments of Formula IIa, g=1.

In some embodiments of Formula IIa, g=2.

In some embodiments of Formula IIa, g=3.

In some embodiments of Formula IIa, g=4.

In some embodiments of Formula IIa, g>0 and $R^7$ is D or $C_{1-10}$ alkyl. In some embodiments, the alkyl group is deuterated.

In some embodiments of Formula IIa, g>0 and $R^7$ is $C_{1-10}$ silyl. In some embodiments, the silyl group is deuterated.

In some embodiments of Formula IIa, g>0 and $R^7$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula IIa, g>0 and $R^7$ is an amino group. In some embodiments, the amino group is deuterated.

In some embodiments of Formula IIa, g=4 and $R^7$=D.

In some embodiments of Formula IIa, h=0.

In some embodiments of Formula IIa, h=1.

In some embodiments of Formula IIa, h=2.

In some embodiments of Formula IIa, h=3.

In some embodiments of Formula IIa, h=4.

In some embodiments of Formula IIa, h>0 and $R^8$ is D or $C_{1-10}$ alkyl. In some embodiments, the alkyl group is deuterated.

In some embodiments of Formula IIa, h>0 and $R^8$ is $C_{1-10}$ silyl. In some embodiments, the silyl group is deuterated.

In some embodiments of Formula IIa, h>0 and $R^8$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula IIa, h>0 and $R^8$ is an amino group. In some embodiments, the amino group is deuterated.

In some embodiments of Formula IIa, h=4 and $R^8$=D.

In some embodiments of Formula IIa, i=0.

In some embodiments of Formula IIa, i=1.

In some embodiments of Formula IIa, i=2.

In some embodiments of Formula IIa, i=3.

In some embodiments of Formula IIa, i=4.

In some embodiments of Formula IIa, i>0 and $R^9$ is D or $C_{1-10}$ alkyl. In some embodiments, the alkyl group is deuterated.

In some embodiments of Formula IIa, i>0 and $R^9$ is $C_{1-10}$ silyl. In some embodiments, the silyl group is deuterated.

In some embodiments of Formula IIa, i>0 and $R^9$ is $C_{6-20}$ aryl or $C_{6-20}$ deuterated aryl. In some embodiments, the aryl group is a hydrocarbon aryl. In some embodiments, the aryl is a heteroaryl.

In some embodiments of Formula IIa, i>0 and $R^9$ is an amino group. In some embodiments, the amino group is deuterated.

In some embodiments of Formula IIa, i=4 and $R^9$=D.

In some embodiments of Formula IIa, two of f-i are greater than zero and two of $R^6$-$R^9$ are not D.

In some embodiments of Formula IIa, three of f-i are greater than zero and three of $R^6$-$R^9$ are not D.

In some embodiments of Formula IIa, four of f-i are greater than zero and four of $R^6$-$R^9$ are not D.

Any of the above embodiments for Formula IIa can be combined with one or more of the other embodiments, so long as they are not mutually exclusive. For example, the embodiment in which $Ar^8$ has Formula 1a can be combined with the embodiment in which $Ar^9$ has Formula 1c'. The same is true for the other non-mutually-exclusive embodiments discussed above. The skilled person would understand which embodiments were mutually exclusive and would thus readily be able to determine the combinations of embodiments that are contemplated by the present application.

Some non-limiting examples of compounds having Formula IIa are shown below.

Compound HTIIa-A

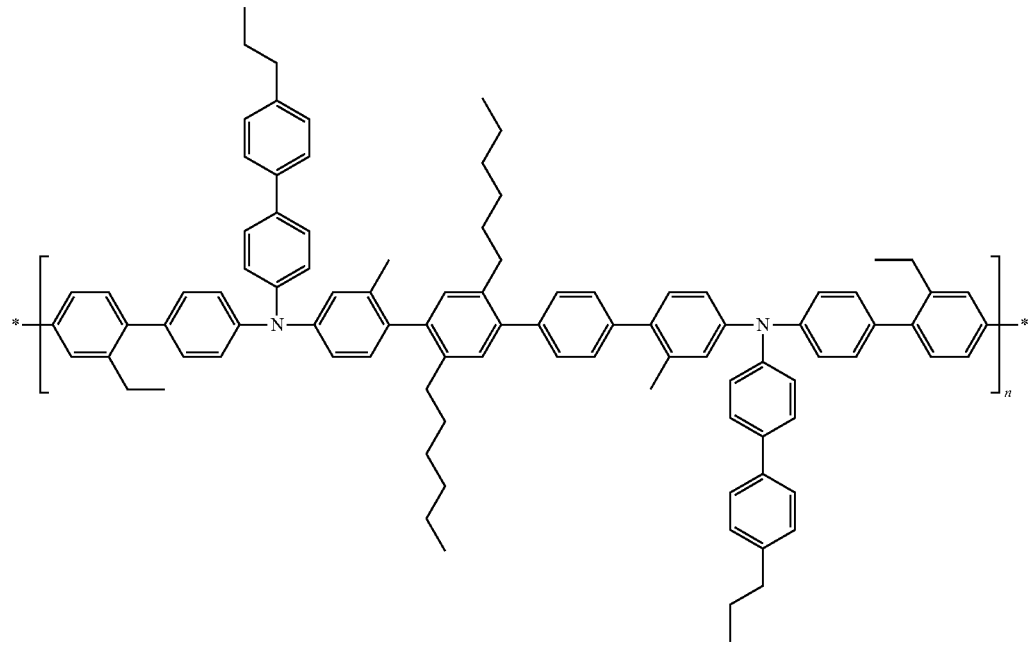

Compound HTIIa-B

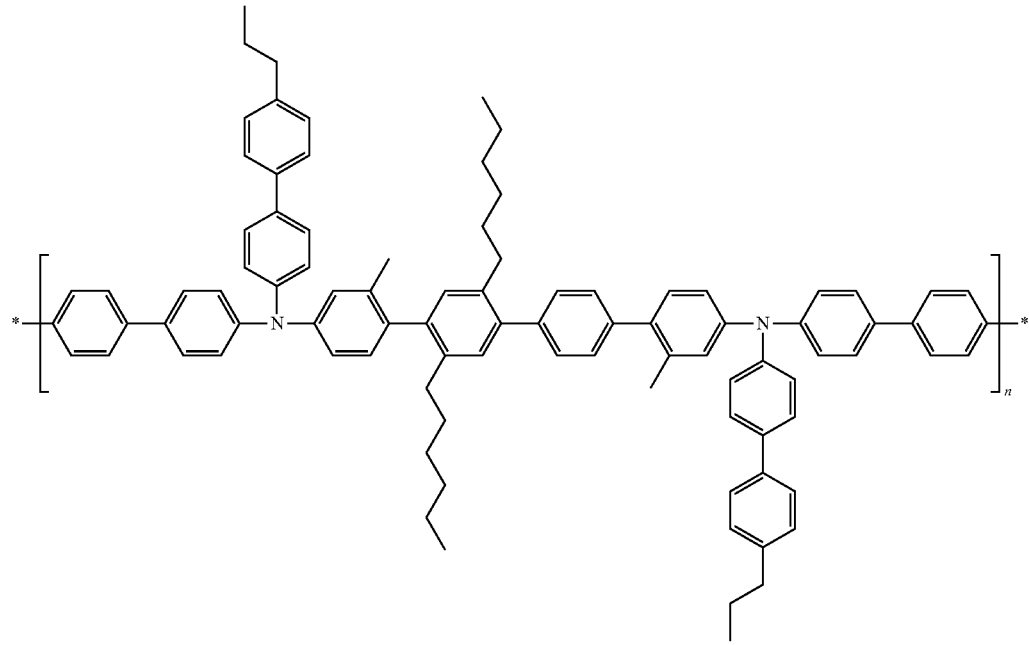

-continued
Compound HTIIa-C
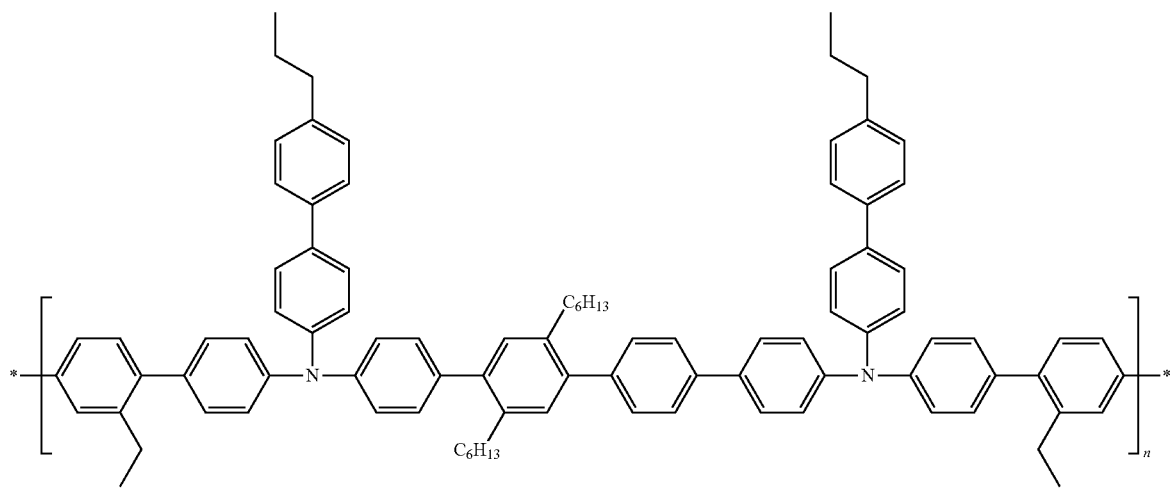
Compound HTIIa-D
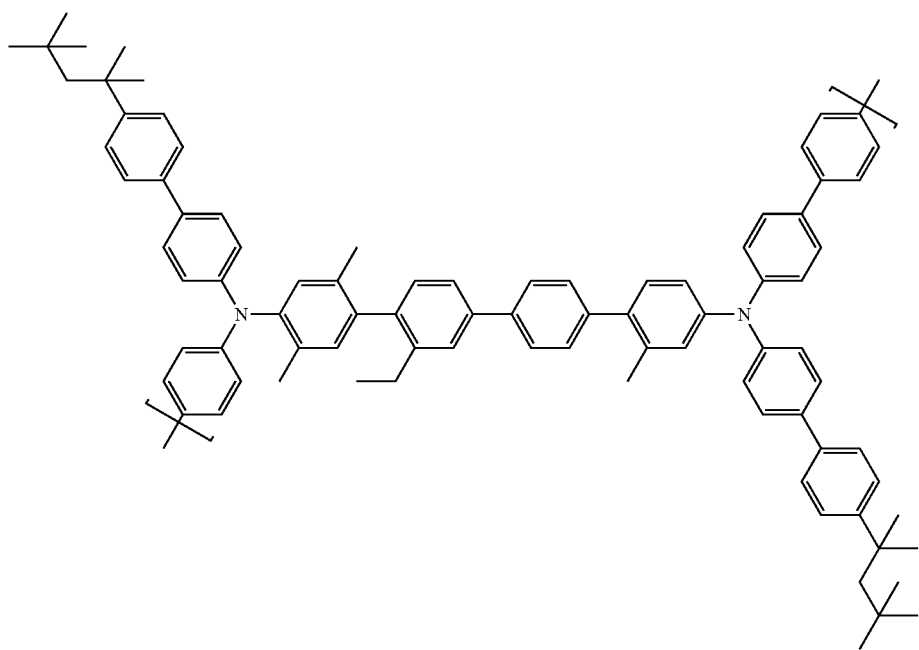

-continued

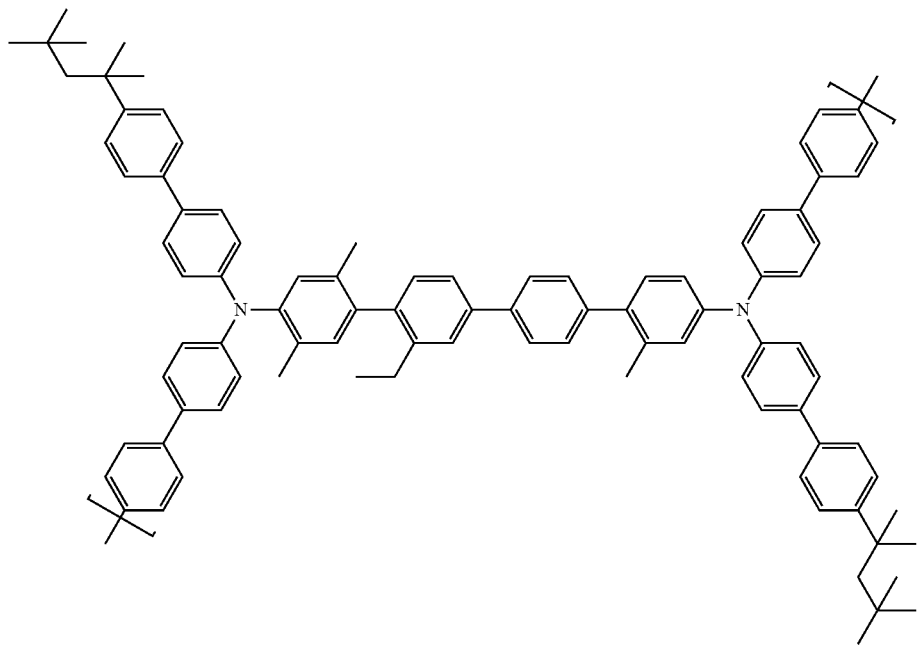

Compound HTIIa-E

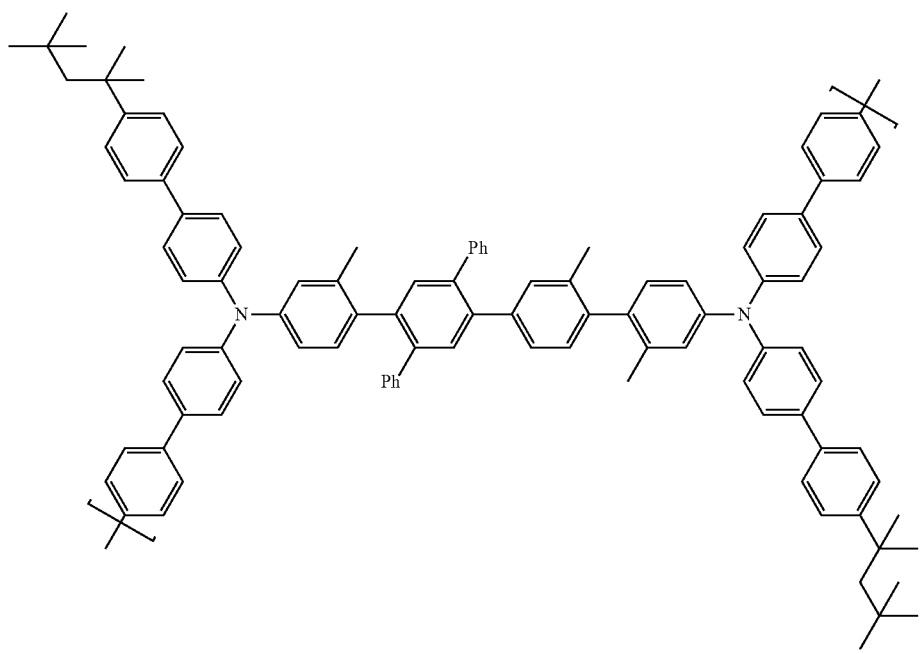

Compound HTIIa-F

The new monomers and polymers can be made using any technique that will yield a C—C or C—N bond. A variety of such techniques are known, such as Suzuki, Yamamoto, Stille, and Pd- or Ni-catalyzed C—N couplings. Deuterated compounds can be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum dichloride. Exemplary preparations are given in the Examples.

The compounds can be formed into layers using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The new compounds having Formula IIa can be used as hole transport materials and as hosts for electroluminescent materials. The new compounds also have utility in one or more layers between the hole injection layer and the hole transport layer.

5. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
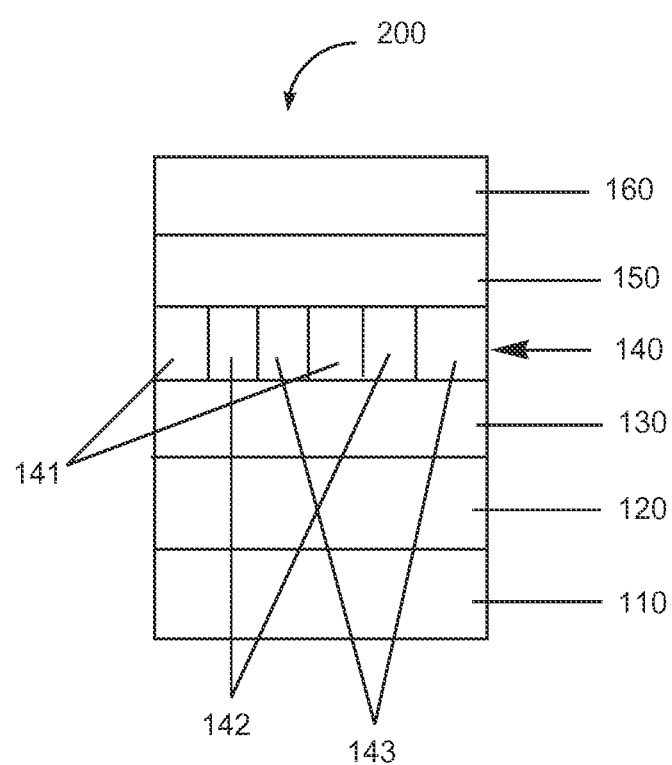
FIG. 2 includes an illustration of another example of an organic electronic device.

In some embodiments, in order to achieve full color, the light-emitting layer is pixellated, with subpixel units for each of the different colors. An illustration of a pixellated device is shown in FIG. 2. The device 200 has anode 110, hole injection layer 120, hole transport layer 130, electroluminescent layer 140, electron transport layer 150, and cathode 160. The electroluminescent layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new compounds having Formula I or Formula II described herein may be present in one or more of the electroactive layers of a device. In some embodiments, the new compounds are useful as hole transport materials in layer 130. In some embodiments, the new compounds are useful as host materials for photoactive dopant materials in photoactive layer 140. The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material to which a dopant is added. The host material may or may not have electronic characteristic(s) or the ability to emit, receive, or filter radiation. In some embodiments, the host material is present in higher concentration.

In some embodiments, an organic electronic device includes an anode, a cathode, and at least one organic active layer therebetween, where the organic active layer includes a compound of Formula I or Formula II.

In some embodiments, an organic electronic device includes an anode, a cathode, and a photoactive layer therebetween, and further includes an additional organic active layer including a compound of Formula I or Formula II. In some embodiments, the additional organic active layer is a hole transport layer.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477-479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material. In some embodiments, the hole transport layer includes a compound having Formula I, Formula II, or Formula IIa.

In some embodiments, the hole transport layer includes only a compound having Formula I, Formula II, or Formula IIa where additional materials that would materially alter the principle of operation or the distinguishing characteristics of the layer are not present therein.

In some embodiments, layer 130 includes other hole transport materials. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4, 4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N,N'-2,5-phenylenediamine (PDA); α-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine.

Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluoro-tetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

In some embodiments, the photoactive layer 140 includes an electroluminescent material in a host material having Formula I or Formula II. In some embodiments, a second host material is also present. In some embodiments, photoactive layer 140 includes only an electroluminescent material and a host material having Formula I or Formula II. In some embodiments, photoactive layer 140 includes only an electroluminescent material, a first host material having Formula I or Formula II, and a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, benzodifurans, and metal quinolinate complexes.

Optional layer 150 can function both to facilitate electron transport, and also serve as a hole injection layer or confinement layer to prevent quenching of the exciton at layer interfaces. Preferably, this layer promotes electron mobility and reduces exciton quenching. Examples of electron transport materials which can be used in the optional electron transport layer 150, include metal chelated oxinoid compounds, including metal quinolate derivatives such as tris (8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof.

In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and Cs2CO3; Group 1 and 2 metal organic compounds, such as Li quinolate; and molecular n-dopants, such as leuco dyes, metal complexes, such as W2(hpp)4 where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, Li2O, Li quinolate, Cs-containing organometallic compounds, CsF, Cs2O, and Cs2CO3. This layer may react with the underlying electron transport layer, the overlying cathode, or both. When an electron injection layer is present, the amount of material deposited is generally in the range of 1-100 Å, in some embodiments 1-10 Å.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode 110 and hole injection layer 120 to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Substrates can be flexible or non-flexible. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as C1 to C20 alcohols, ethers, and acid esters, or can be relatively non-polar such as C1 to C12 alkanes or aromatics such as toluene, xylenes, trifluorotoluene and the like. Other suitable liquids for use in making the liquid composition, either as a solution or dispersion as described herein, including the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), ketones (cyclopentatone) and mixtures thereof. Suitable solvents for electroluminescent materials have been described in, for example, published PCT application WO 2007/145979.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Synthesis Examples 1 and 2

These examples illustrates the synthesis of hole transport compounds having Formula IIa: HTIIa-A and HTIIa-B. They are based on the intermediates prepared in Scheme 1.

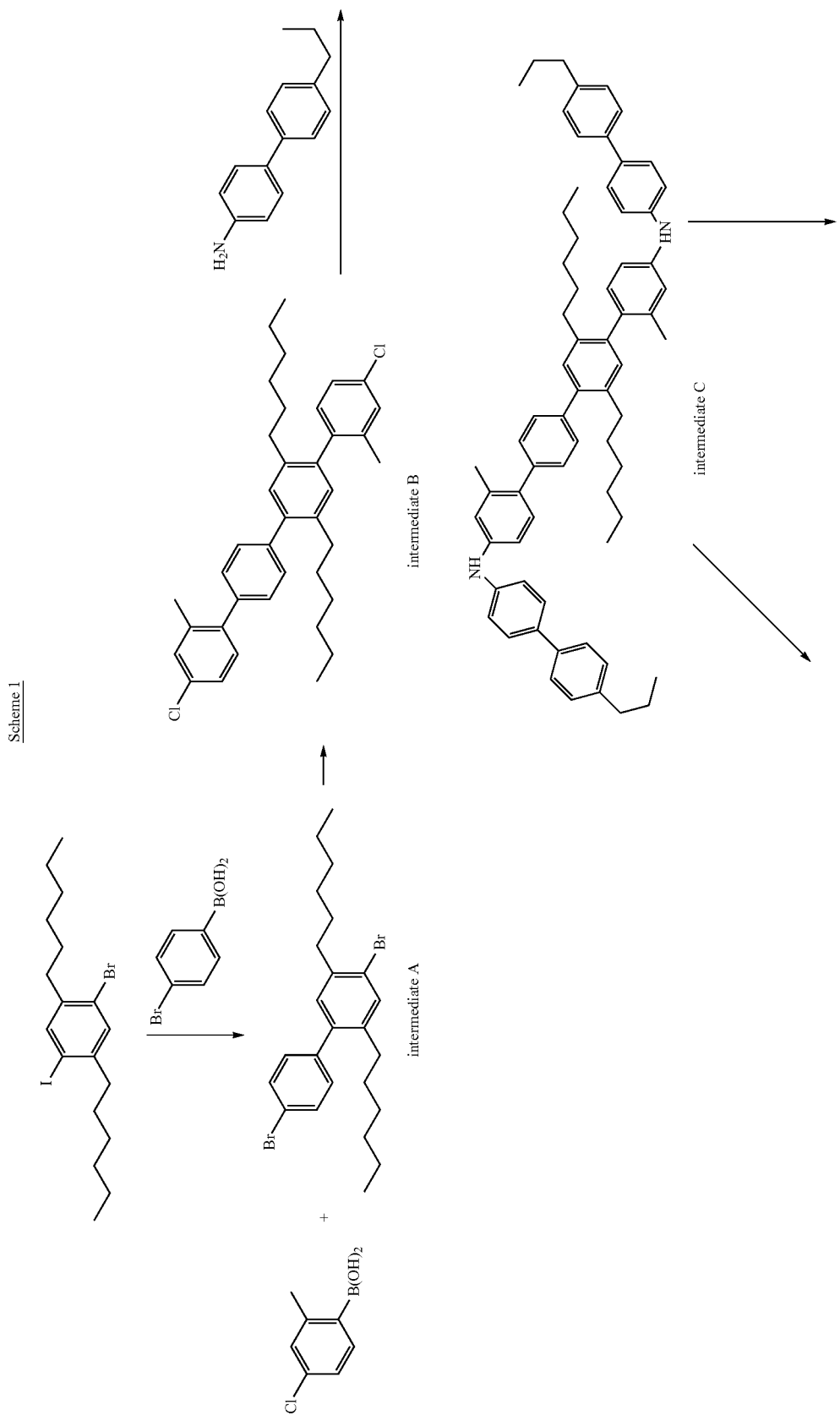

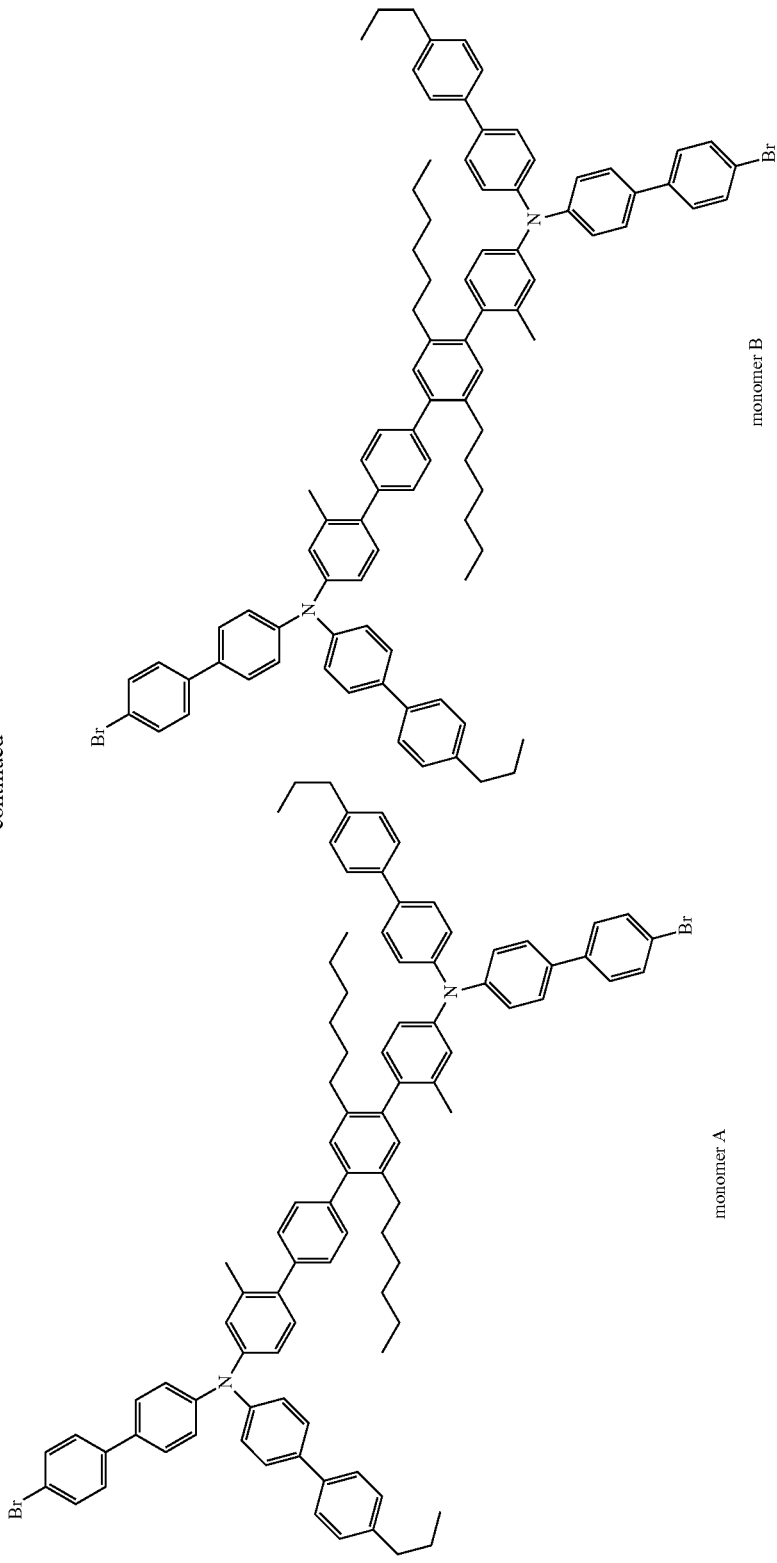

Synthesis of Intermediate A

To a 200 mL round bottom under nitrogen were added 1-bromo-4-iodo-2,5-dihexylbenzene (4.00 g), 4-bromophenylboronic acid (1.91 g) and $Na_2CO_3$ (5.64 g). The solids were dissolved in o-xylene:$H_2O$ (1:1, 50 mL). The solution was degassed using $N_2$. The catalyst $Pd(PPh_3)_4$ (0.512 g) was added. The reaction mixture was heated while stirring under nitrogen to 100° C. for 16 hours. 50 mL of o-xylene was added and the aqueous and organic layers were separated. The organic layer was dried with sodium sulfate and concentrated on Celite for flash chromatographic purification on silica. The product was isolated as a white powder in 69.4% yield (3.04 g) from hexane eluent.

Synthesis of Intermediate B

To a three neck 1 L flask was added intermediate A (15 g, 31.22 mmol), 4-Chloro-2-methylphenylboronic acid (11.81 g, 69.33 mmol) and Cesium carbonate (1.68 g, mmol). DME:Ethanol:Water (6:3:1) were added to the flask and the solution was degassed by bubbling nitrogen through it for 15 minutes. 1,1'-Bis[(diphenyl-phosphino)ferrocene] dichloropalladium(II) (1.28 g, 1.56 mmol) was added and the solution was further degassed for 5 min. The mixture was heated overnight at 70° C. The reaction was allowed to cool and dicholoromethane was added to the crude solution. The layers were separated and the organic layer was dried. The crude material was purified using chromatography on silica using hexane. The desired product was isolated as a clear oil in 65.4% yield (11.12 g).

Synthesis of Intermediate C

To a 200 mL round bottom under nitrogen were added intermediate B (1.80 g, 3.15 mmol), 4-propylbiphenyl aniline (6.93 mmol), $Pd_2(dba)_3$ (0.157 mmol), $PtBu_3$ (0.315 mmol) and anhydrous toluene (50 mL). Once all the starting materials were dissolved, NaOtBu (7.87 mmol) was added and the resulting mixture was heated to 80° C. overnight. The solution was cooled to room temperature and then quenched with ~50 mL of water. The layers were separated, the organic layer was dried over $MgSO_4$, and the crude material was purified using silica chromatography with DCM:hexane—0-30% as the eluent. The desired product was obtained as a white solid in 65.5% yield (1.9 g).

Synthesis of Monomer A

To a 200 mL round bottom under nitrogen were added intermediate C (1.00 g, 1.09 mmol), 1-bromo-4-iodobiphenyl (3.36 mmol), $Pd_2(dba)_3$ (0.152 mmol), dppf (0.304 mmol) and anhydrous toluene (50 mL). Once all the starting materials were dissolved, NaOtBu (2.71 mmol) was added and the resulting mixture was heated to 95° C. for four hours. The solution was cooled to room temperature and then quenched with ~50 mL of water. The layers were separated, organic layer was dried over $MgSO_4$ and the crude material was purified using silica chromatography with DCM:hexane—0-30% as the eluent. The desired product was obtained as a white solid in 80% yield (1.2 g).

Synthesis of Hole Transport Polymer HTIIa-B

Monomer A (0.361 mmol) and 4-bromobiphenyl (0.021 mmol) were added to a scintillation vial and dissolved in 15 mL toluene. A clean, dry 50 mL Schlenk tube was charged with bis(1,5-cyclooctadiene)nickel(0) (0.772 mmol). 2,2'-Dipyridyl (0.772 mmol) and 1,5-cyclooctadiene (0.772 mmol) were weighed into a scintillation vial and dissolved in 6 mL N,N'-dimethylformamide. The solution was added to the Schlenk tube, which was then inserted into an aluminum block and heated to an internal temperature of 60° C. The catalyst system was held at 60° C. for 30 minutes. The monomer solution in toluene was added to the Schlenk tube and the tube was sealed. The polymerization mixture was stirred at 60° C. for three hours. The Schlenk tube was then removed from the block and allowed to cool to room temperature. The contents were poured into HCl/methanol (5% v/v, conc. HCl). After stirring for 45 minutes, the polymer was collected by vacuum filtration and dried under high vacuum. The polymer was dissolved in toluene (1% wt/v) and passed through a column containing aluminum oxide, basic. (6 gram) layered onto silica gel (6 gram). The polymer/toluene filtrate was concentrated (3% wt/v toluene) and triturated with 3-pentanone. The toluene/3-pentanone solution was decanted from the semi-solid polymer which was then dissolved with 10 mL toluene before being poured into stirring methanol to yield hole transport polymer HTIIa-B in 65% yield. GPC analysis with polystyrene standards Mn=77,177; Mw=142,662; PDI=1.8.

Synthesis of Monomer B

Synthesis of monomer B was performed as described for monomer A but using 4-bromo-2-ethyl-4'-iodobiphenyl instead of 4-bromo-1-iodobiphenyl. The desired monomer was isolated in 71% yield.

Synthesis of Hole Transport Polymer HTIIa-A

The synthesis of hole transport polymer HTIIa-A was performed as in the case of polymer A but using 0.347 mmol of monomer B, 0.010 mmol of 4-bromobiphenyl and 0.72 mmol of each of the following $Ni(COD)_2$, bipy and COD. The desired polymer was isolated in 62% yield and with Mn=93,585 and Mw=154,565.

Synthesis Examples 3 and 4

These examples illustrates the synthesis of hole transport compounds having Formula I: HTI-B and HTI-C. They are based on the intermediates prepared in Scheme 2.

Scheme 2
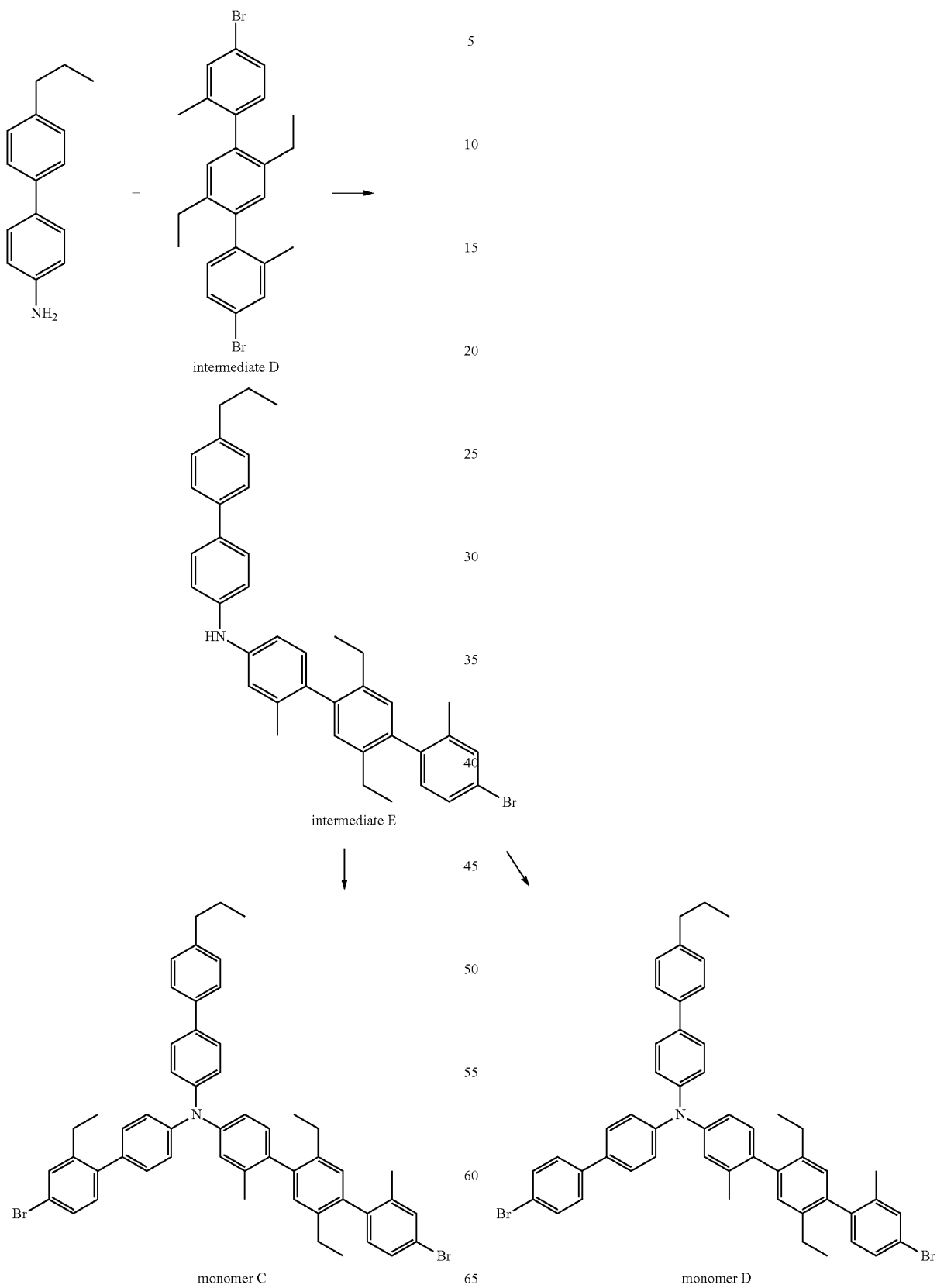

Synthesis of Intermediate E

To a 200 mL round bottom under nitrogen were added intermediate D (5.00 g, 10.6 mmol), 4-propylbiphenyl aniline (9.53 mmol), Pd$_2$(dba)$_3$ (0.52 mmol), dppf (1.06 mmol) and anhydrous toluene (50 mL). Once all the starting materials were dissolved, NaOtBu (6.35 mmol) was added and the resulting mixture was heated to 60° C. for three hours. The solution was cooled to room temperature and then quenched with ~50 mL of water. The layers were separated, organic layer was dried over MgSO$_4$ and the crude material was purified using silica chromatography with DCM:hexane—0-30% as the eluent. The desired product was obtained as a white solid in 28% yield (1.8 g).

Synthesis of Monomer C

Synthesis of monomer C was performed as described for monomer A but using intermediate E and 4-bromo-2-ethyl-4'-iodobiphenyl. The desired monomer was isolated in 61% yield.

Synthesis of Hole Transport Polymer HTI-B

The synthesis of hole transport polymer HTI-B was performed as in the case of hole transport polymer HTIIa-B but using 0.754 mmol of monomer C, 0.023 mmol of 4-bromobiphenyl and 1.06 mmol of each of the following Ni(COD)$_2$, bipy and COD. The desired polymer was isolated in 57% yield and with Mn=68,492 and Mw=101,555.

Synthesis of Monomer D

Synthesis of monomer D was performed as described for monomer A but using intermediate E and 1-bromo-4-iodobiphenyl. The desired monomer was isolated in 45% yield.

Synthesis of Hole Transport Polymer HTI-C

The synthesis of hole transport polymer HTI-C was performed as in the case of hole transport polymer HTIIa-B but using 0.420 mmol of monomer B, 0.022 mmol of 4-bromobiphenyl and 0.893 mmol of each of the following Ni(COD)$_2$, bipy and COD. The desired polymer was isolated in 60% yield and with Mn=77,611 and Mw=124,003.

Synthesis Example 5

This examples illustrates the synthesis of a hole transport compound having Formula I, HTI-A, based on the intermediate prepared in Scheme 3.

Scheme 3

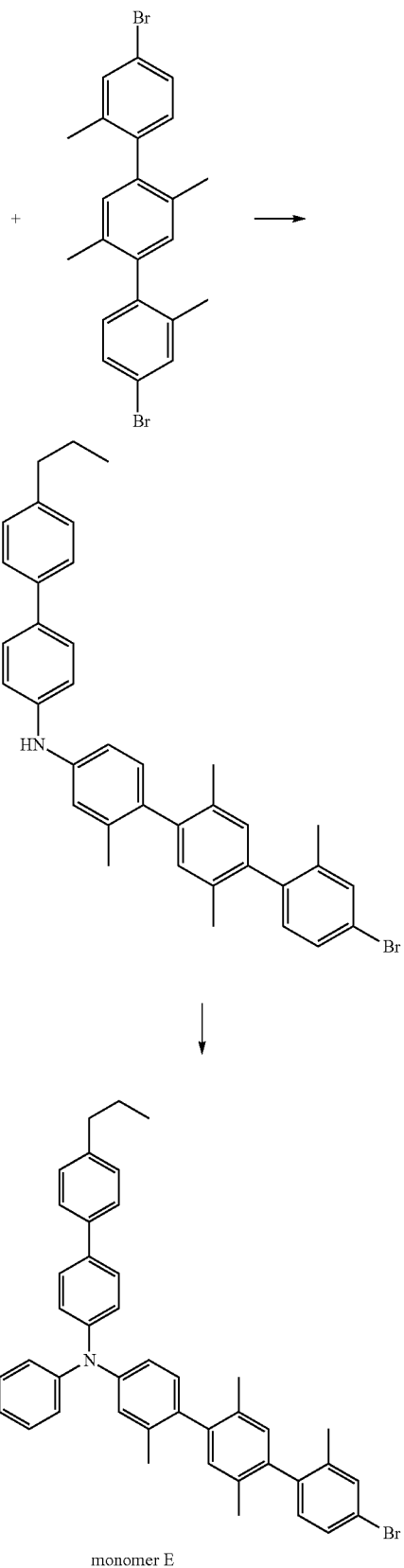

monomer E

Synthesis of Monomer E

Synthesis of monomer E was performed as shown in scheme 3 and described for monomer D.

Synthesis of Hole Transport Polymer HTI-A

The synthesis of hole transport polymer HTI-A was performed as in the case of hole transport polymer HTIIa-B but using 0.807 mmol of monomer B, 0.050 mmol of 4-bromobiphenyl and 1.73 mmol of each of the following Ni(COD)$_2$, bipy and COD. The desired polymer was isolated in 69% yield and with Mn=68,505 and Mw=111,598.

Synthesis Comparative Compound 1

Comparative Compound 1

Comparative Compound 1

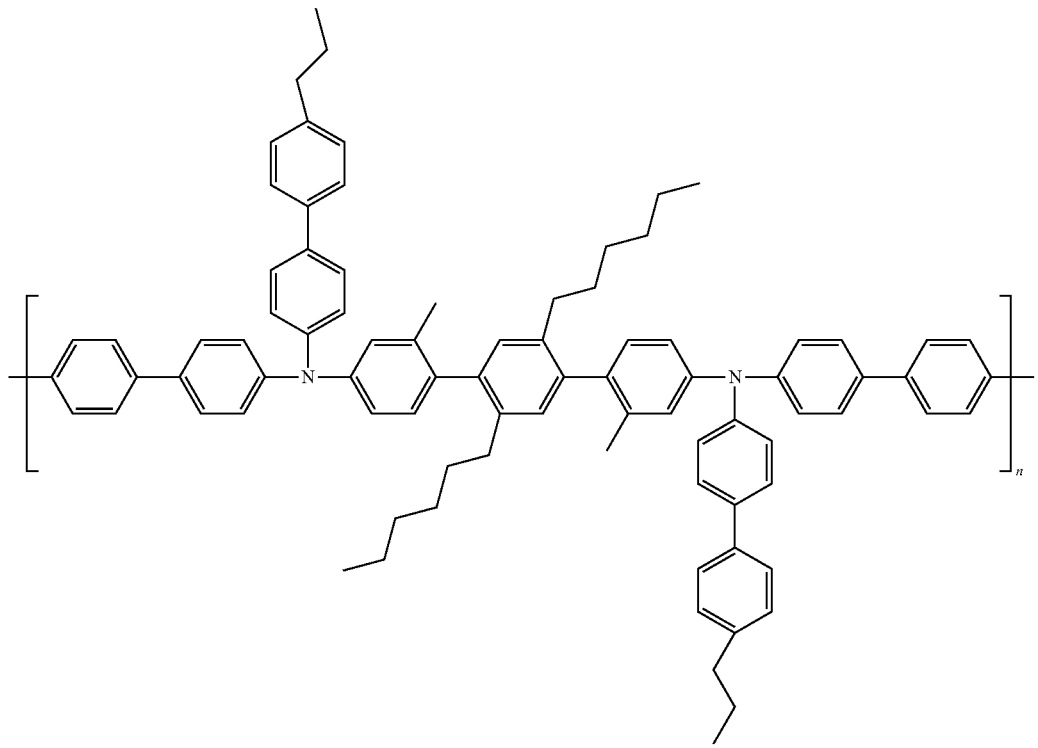

Comparative Compound 1 was prepared as described in published US patent application 2013/0082251 A1.

Device Examples

Device Materials

D-1 is a blue benzofluorene dopant. Such materials have been described, for example, in U.S. Pat. No. 8,465,848.
D-2 is a blue diaminochrysene dopant.

ET-1 is:

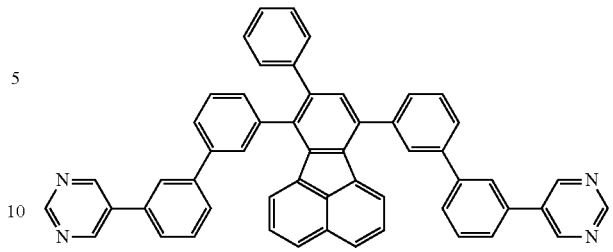

ET-2 is lithium quinolate.
HIJ-1 is a hole injection material which is made from an aqueous dispersion of an electrically conductive polymer and a polymeric fluorinated sulfonic acid. Such materials have been described in, for example, U.S. Pat. No. 7,351,358.
Host H-1 is a deuterated anthracene compound.
Hole Transport Materials are as indicated in the examples below.

Device Fabrication

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission.

The patterned ITO substrates were cleaned and spin-coated with an aqueous dispersion of a hole injection material (HIJ-1). A hole transport layer was formed by spin-coating a solution of hole transport material in a liquid medium and heated to remove the liquid medium. The workpieces were then coated with the photoactive layer materials either by spin-coating a solution of the materials in methyl benzoate and then heating to remove solvent or thermal evaporation. All thermal evaporation was done by placing the workpieces in a vacuum chamber and masking them. A layer of electron transport material and a layer of electron injection material were then deposited by thermal evaporation. Masks were then changed in vacuo and a layer of Al was deposited by thermal evaporation. The chamber was vented, and the devices were encapsulated using a glass lid, desiccant, and UV curable epoxy.

Device Characterization

The OLED samples were characterized by measuring their (1) current-voltage (I-V) curves, (2) electroluminescence luminance versus voltage, and (3) electroluminescence spectra versus voltage. All three measurements were performed at the same time and controlled by a computer. The current efficiency of the device at a certain voltage is determined by dividing the electroluminescence luminance of the LED by the current density needed to run the device. The unit is a cd/A. The color coordinates were determined using either a Minolta CS-100 meter or a Photoresearch PR-705 meter.

Device Examples 1, 2, 3, and Comparative A

This example illustrates the performance of compounds having Formula I and Formula IIa in an organic electronic device wherein the photoactive layer is applied to the HTL via solution processing.

Device Structure:
Glass substrate
ITO: 50 nm
Hole injection layer: HIJ-1 (100 nm)
Hole transport layer: see Table 1
Photoactive layer: 7% of D-1+93% of H-1 (38 nm)
Electron transport layer: ET-1 (20 nm)
Electron injection layer: LiQ (3 nm)
Al cathode (100 nm)

TABLE 1

Device performance for Examples 1, 2, and Comparative A

| Example Number | HTL (thickness, nm) | Voltage (V) @ 15 mA/cm$^2$ | E.Q.E. (%) @1000 nits | C.E. (cd/A) @1000 nits | P.E. (lm/W) @1000 nits | CIE (X,Y) (1931) @1000 nits |
|---|---|---|---|---|---|---|
| 1 | HTI-B (105) | 6.7 | 7.1 | 6.2 | 2.8 | (0.139, 0.098) |
| 2 | HTI-C (105) | 4.9 | 6.6 | 5.3 | 3.2 | (0.141, 0.089) |
| 3 | HTIIa-B (102) | 4.8 | 6.4 | 5.4 | 3.3 | (0.140, 0.094) |
| Comp. A | Comparative Compound 1 (99) | 4.7 | 6.1 | 5.0 | 3.1 | (0.142, 0.090) |

E.Q.E. is the external quantum efficiency; CIE(x, y) are the x and y color coordinates according to the C.I.E. chromaticity scale (Commission Internationale de L'Eclairage, 1931).

Device Examples 4, 5, and Comparative B

This example illustrates the performance of compounds having Formula IIa in an organic electronic device wherein the photoactive layer is applied to the HTL via vapor deposition.

Device Structure:
Glass substrate
ITO: 50 nm
Hole injection layer: HIJ-1 (100 nm)
Hole transport layer: see Table 1
Photoactive layer: 14% of D-2+86% of H-1 (38 nm)
Electron transport layer: ET-1 (20 nm)
Electron injection layer: LiQ (3 nm)
Al cathode (100 nm)

TABLE 2

Device performance for Examples 4, 5, and Comparative B

| Example Number | HTL (thickness, nm) | Voltage (V) @ 15 mA/cm$^2$ | E.Q.E. (%) @1000 nits | C.E. (cd/A) @1000 nits | P.E. (lm/W) @1000 nits | CIE (X,Y) (1931) @1000 nits |
|---|---|---|---|---|---|---|
| 4 | HTIIa-a (104) | 7.6 | 8.9 | 7.9 | 3.5 | (0.138, 0.101) |
| 5 | HTIIa-B (100) | 4.2 | 8.1 | 7.4 | 5.4 | (0.137, 0.105) |

TABLE 2-continued

Device performance for Examples 4, 5, and Comparative B

| Example Number | HTL (thickness, nm) | Voltage (V) @ 15 mA/cm² | E.Q.E. (%) @1000 nits | C.E. (cd/A) @1000 nits | P.E. (lm/W) @1000 nits | CIE (X,Y) (1931) @1000 nits |
|---|---|---|---|---|---|---|
| Comp. B | Comparative Compound 1 (102) | 5.8 | 8.7 | 7.7 | 3.9 | (0.138, 0.101) |

E.Q.E. is the external quantum efficiency; CIE(x, y) are the x and y color coordinates according to the C.I.E. chromaticity scale (Commission Internationale de L'Eclairage, 1931).

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A hole transport compound having Formula I:

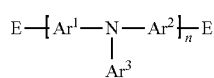

Formula I where:
Ar¹-Ar³ are selected from the group consisting of aryl groups and deuterated aryl groups, with the proviso that Ar¹ is not the same as Ar²;
E is the same or different at each occurrence and is selected from the group consisting of H, D, halide, alkyl, aryl, siloxane, deuterated alkyl, deuterated aryl, deuterated siloxane, and a crosslinking group;
and
n is an integer greater than or equal to 1.

2. The hole transport compound of claim 1, wherein the hole transport compound is deuterated.

3. The hole transport compound of claim 1, wherein Ar¹ has Formula 1a:

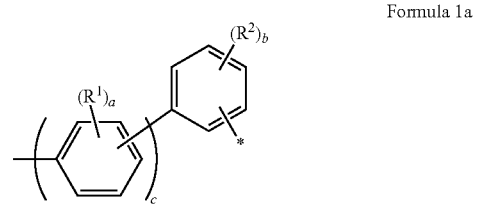

Formula 1a wherein:
R¹ and R² are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R¹ and R² can be joined together to form a fused ring;
a and b are the same or different at each occurrence and are an integer from 0-4;
c is an integer greater than or equal to 0;
* indicates the point of attachment to E.

4. The hole transport compound of claim 3, wherein c=1.

5. The hole transport compound of claim 4, wherein a=b=0.

6. The hole transport compound of claim 3, wherein b>0 and R² is an alkyl or deuterated alkyl group.

7. The hole transport compound of claim 1, wherein Ar² has Formula 1b:

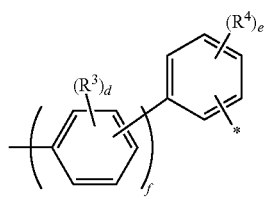

Formula 1b wherein:
R³ and R⁴ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;

d and e are the same or different at each occurrence and are an integer from 0-4;

f is an integer greater than or equal to 0;
* indicates the point of attachment to E.

8. The hole transport compound of claim 7; wherein d, e, and f are greater than 0.

9. The hole transport compound of claim 8, wherein R³ and R⁴ are alkyl or deuterated alkyl groups.

10. The hole transport compound of claim 1, wherein Ar³ has Formula 1c:

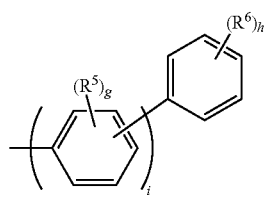

Formula 1c where:
R⁵ and R⁶ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R5 and R6 can be joined together to form a fused ring;
g is the same or different at each occurrence and is an integer from 0-4;
h is an integer from 0-5; and
i is an integer greater than or equal to 0.

11. The hole transport compound of claim 10, wherein h>0 and R⁶ is an alkyl or deuterated alkyl group.

12. An organic electronic device wherein one or more of the electroactive layers of the device contains a hole transport compound having Formula I:

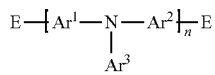

Formula I where:
Ar¹-Ar³ are selected from the group consisting of aryl groups and deuterated aryl groups, with the proviso that Ar¹ is not the same as Ar²;
E is the same or different at each occurrence and is selected from the group consisting of H, D, halide, alkyl, aryl, siloxane, deuterated alkyl, deuterated aryl, deuterated siloxane, and a crosslinking group;
and
n is an integer greater than or equal to 1.

13. The organic electronic device of claim 11, wherein the electroactive layer of the device is the hole transport layer.

14. A hole transport compound having Formula II:

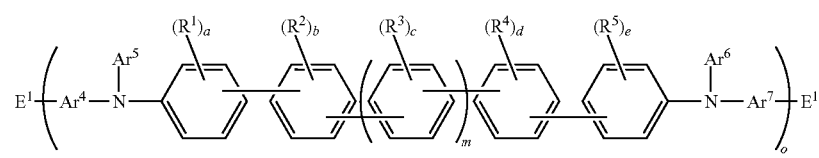

Formula II wherein:
Ar$^4$-Ar$^7$ are the same or different and are aryl groups or deuterated aryl groups;
E$^1$ is the same or different at each occurrence and is selected from the group consisting of H, D, halide, alkyl, aryl, siloxane, deuterated alkyl, deuterated aryl, deuterated siloxane, and a crosslinking group;
R$^1$-R$^5$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R$^1$-R$^5$ can be joined together to form a fused ring;
a-e are the same or different and are in integer from 0-4;
m is an integer from 0-6;
o is an integer greater than or equal to 1;
with the proviso that at least two of a-e are greater than zero and at least two of R$^1$-R$^5$ are not D.

15. The hole transport compound of claim 14, wherein the hole transport compound is deuterated.

16. The hole transport compound of claim 14, wherein the hole transport compound has Formula IIa:

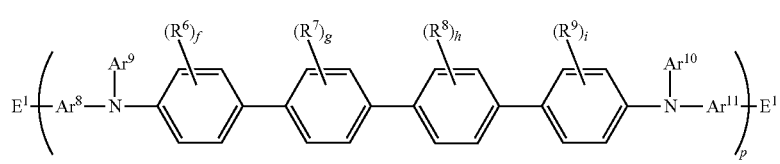

Formula IIa wherein:
Ar$^8$-Ar$^{11}$ are the same or different and are aryl groups or deuterated aryl groups;
E$^2$ is the same or different at each occurrence and is selected from the group consisting of H, D, halide, alkyl, aryl, siloxane, deuterated alkyl, deuterated aryl, deuterated siloxane, and a crosslinking group;
R$^6$-R$^9$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from R$^1$-R$^5$ can be joined together to form a fused ring;

f-i are the same or different and are in integer from 0-4;

p is an integer greater than or equal to 1;

with the proviso that at least two of f-i are greater than zero and at least two of R$^6$-R$^9$ are not D.

17. The hole transport compound of claim 16, wherein at least one of f-i is non-zero and the corresponding R$^6$-R$^9$ is an alkyl or deuterated alkyl group.

18. The hole transport compound of claim 17, wherein Ar$^8$=Ar$^{11}$.

19. The hole transport compound of claim 18, wherein g>0 and R$^7$ is C$_{6-20}$ aryl or C$_{6-20}$ deuterated aryl.

20. An organic electronic device wherein one or more of the electroactive layers of a device contains a hole transport compound having Formula II:

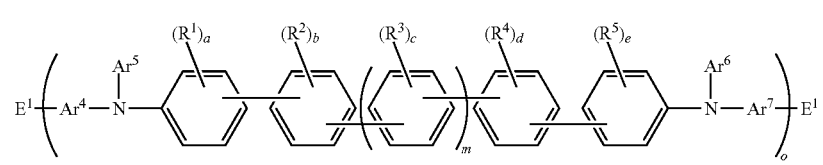

Formula II wherein:
Ar$^4$-Ar$^7$ are the same or different and are aryl groups or deuterated aryl groups;

$E^1$ is the same or different at each occurrence and is selected from the group consisting of H, D, halide, alkyl, aryl, siloxane, deuterated alkyl, deuterated aryl, deuterated siloxane, and a crosslinking group;

$R^1$-$R^5$ are the same or different at each occurrence and selected from the group consisting of D, F, CN, alkyl, fluoroalkyl, aryl, heteroaryl, amino, silyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated alkoxy, deuterated aryloxy, deuterated fluoroalkoxy, deuterated siloxane, deuterated siloxy, and crosslinking groups, wherein adjacent groups selected from $R^1$-$R^5$ can be joined together to form a fused ring;

a-e are the same or different and are in integer from 0-4;

m is an integer from 0-6;

o is an integer greater than or equal to 1;

with the proviso that at least two of a-e are greater than zero and at least two of $R^1$-$R^5$ are not D.

* * * * *